United States Patent [19]
Willis

[11] Patent Number: 5,447,576
[45] Date of Patent: Sep. 5, 1995

[54] COMPOSITION AND METHOD FOR ENCAPSULATING A SOLAR CELL WHICH MINIMIZES THERMAL DISCOLORATION

[75] Inventor: Paul B. Willis, Altadema, Calif.

[73] Assignee: Siemens Solar Industries International, Inc., Camarillo, Calif.

[21] Appl. No.: 924,270

[22] Filed: Aug. 3, 1992

[51] Int. Cl.⁶ ............................................. H01L 31/048
[52] U.S. Cl. ..................................... 136/259; 136/251; 437/2; 437/219; 437/224; 437/211; 257/789
[58] Field of Search ............................................ 437/2-5, 437/211, 219, 224, 235, 243; 427/74, 385.5; 136/251, 259; 257/632, 789

[56] References Cited

U.S. PATENT DOCUMENTS 4,499,658  2/1985  Lewis ..................................... 437/2

OTHER PUBLICATIONS

A. Desombre et al, *Proceedings 4th E.C. Photovoltaic Solar Energy Conf.* May 1982, pp. 377-381.
J. H. Wohlegemuth et al, *Solar Cells*, vol. 30, pp. 383-387, May 1991.

*Primary Examiner*—Aaron Weisstuch
*Attorney, Agent, or Firm*—Donald M. Boles

[57] ABSTRACT

A composition and method for encapsulating a solar cell which minimizes thermal discoloration, or browning, of the encapsulant. The composition includes an EVA encapsulant, a curing agent and one of two particularly well-suited hindered amine light stabilizers, either O,O-t-Amyl-O-(1,2,2,6,6-Pentamethyl-4-piperidinyl) mono-peroxycarbonate or Poly[(4-hydroxy-2,2,6,6-tetramethyl-1-piperidine-ethanol)-co-dimethyl succinate]. Alternatively, if the selected hindered amine light stabilizer is O,O-t-Amyl-O-(1,2,2,6,6-Pentamethyl-4-piperidinyl) mono-peroxycarbonate, the curing agent need not be included. The composition is applied to a solar cell then cured. The cured product withstands thermal exposure and resists thermal discoloration.

7 Claims, 3 Drawing Sheets

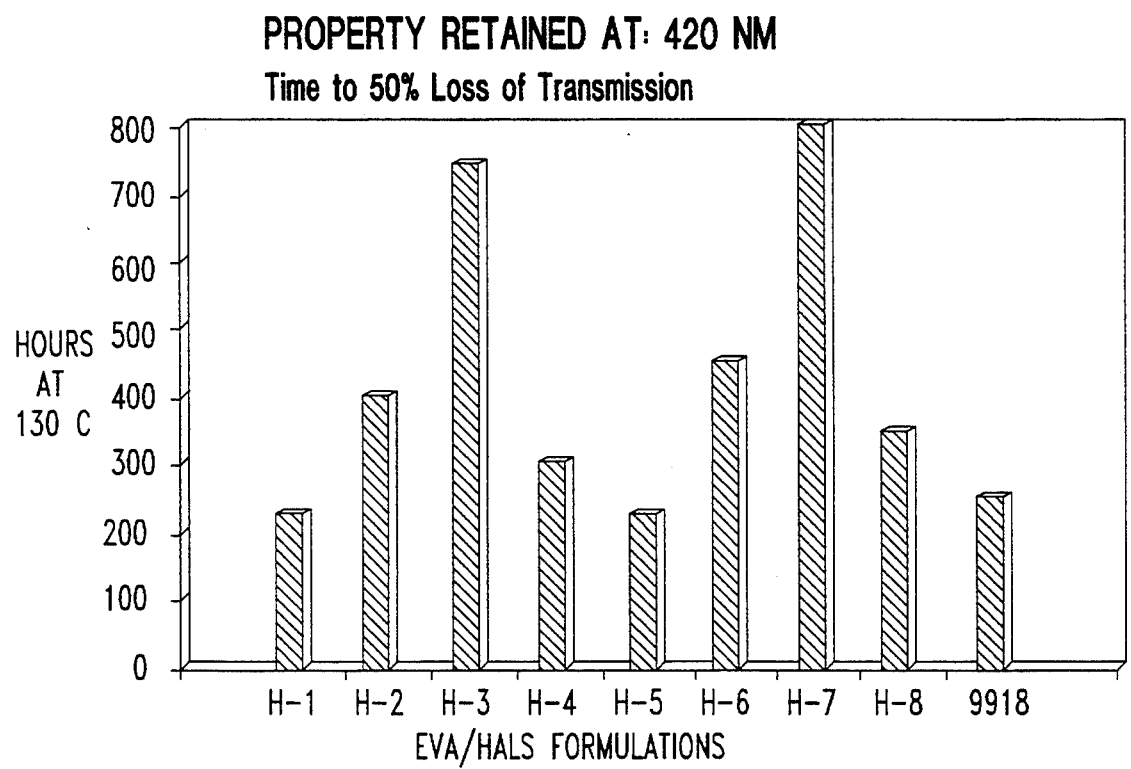
FIG. 5
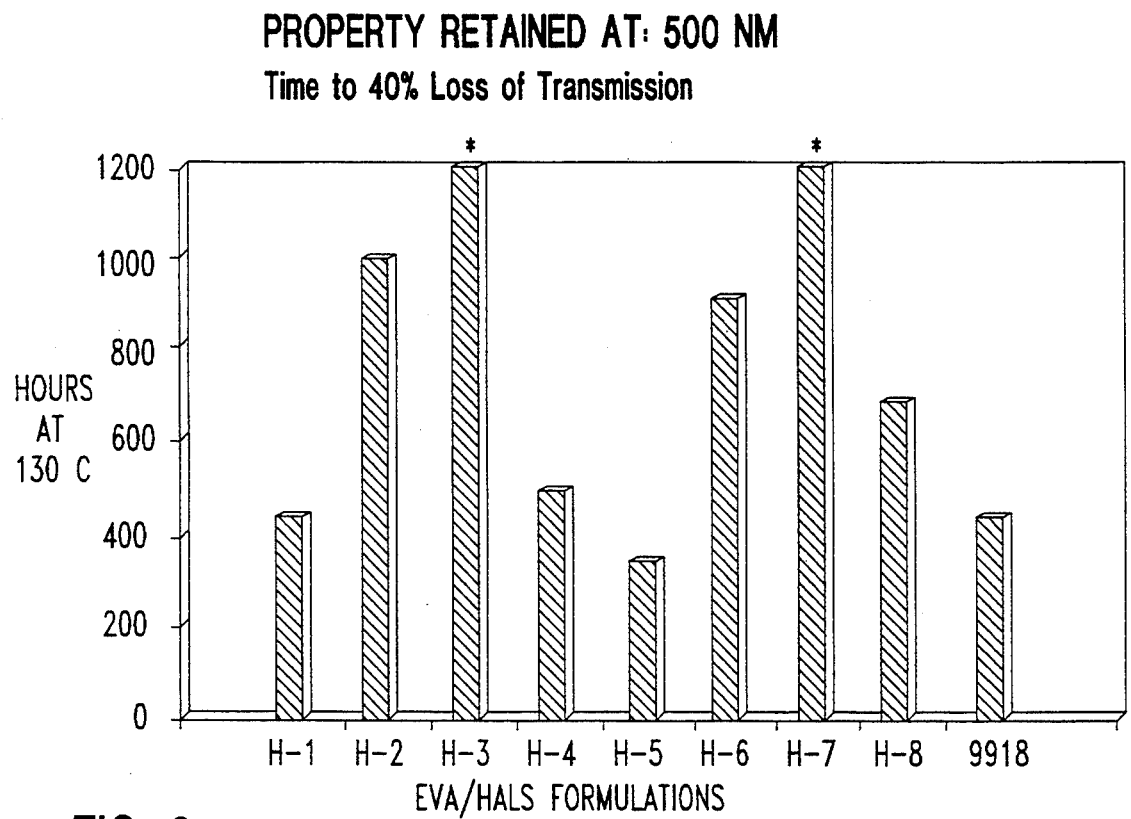
FIG. 6   * Not completed at this time

COMPOSITION AND METHOD FOR ENCAPSULATING A SOLAR CELL WHICH MINIMIZES THERMAL DISCOLORATION

FIELD OF THE INVENTION

This invention pertains to encapsulants for solar cells. More particularly, this invention pertains to a composition of an EVA encapsulant which minimizes thermal discoloration.

BACKGROUND OF THE INVENTION

Encapsulants used to protect solar cells from the environment must possess several characteristics. First, the encapsulant must be easily deformable, prior to being cured, so it can conform to the shape of the solar cell for proper sealing without breaking the relatively fragile solar cell. Also, the cured formulation of the encapsulant must be a thermoset compound, i.e. a compound which is resistant to flow when exposed to heat. Because a solar cell is exposed to heat during its normal operation, a compound which readily flows when exposed to heat, i.e. a thermoplastic compound, would not be suitable for use as an encapsulant. A thermoplastic compound would likely flow off of the solar cell, thereby causing the solar cell to become exposed during its normal operation. Additionally, the encapsulant must be adhesive to adhere to the cell and other components during operation. Finally, the encapsulant must be optically transparent.

Ethylene-vinyl acetate (EVA) co-polymers are among the most widely used encapsulants for the manufacture of solar cells, or solar modules. However, field experience shows that a gradual discoloration develops within the encapsulant. This discoloration lowers the power output of the module by approximately 5%. This discoloration effect has been primarily noticed in hot environments; however, EVA encapsulants in other environments also tend to eventually show discoloration. This discoloration may be caused by exposure to heat, i.e. thermal discoloration, and/or by exposure to light, such as ultraviolet light. The discoloration appears as a yellowing of the EVA encapsulant, which is an absorption in the blue end of the spectrum, and decreases the power conversion in this range.

In the past, some additives have been used to attempt to minimize encapsulant discoloration. One such additive is the compound Bis-(Tetramethyl piperidinyl sebacate), produced by Ciba-Geigy Corporation of Hawthorne, N.Y. and sold under the trademark "TINUVIN 770". However, a need still exists to further minimize thermal discoloration.

SUMMARY OF THE INVENTION

The present invention is directed to a composition for encapsulating a solar cell and minimizing thermal discoloration of the encapsulant. The composition includes an ethylene-vinyl acetate (EVA) copolymer, a curing agent and one of two particularly well-suited hindered amine light stabilizers, either 0,0-t-Amyl-O-(1,2,2,6,6-Pentamethyl-4-piperidinyl) mono-peroxycarbonate or Poly[(4-hydroxy-2,2,6,6-tetramethyl-1-piperidine-ethanol) -co-dimethyl succinate]. The curing agent may be either 2,5-Dimethyl-2,5-Di-t-Butylperoxyhexane; or O,O-t-Butyl-O-(2-ethylhexyl) mono-peroxycarbonate or any other conventional curing agent.

In an alternative embodiment of the present invention, the composition includes only an EVA copolymer and O,O-t-Amyl-O-(1,2,2,6,6-Pentamethyl-4-piperidinyl) mono-peroxycarbonate, which serves the functions of both the curing agent and the hindered amine light stabilizer.

In one embodiment of the present invention, a primer may be added to the formulation to serve to enhance adherence of the encapsulant to the solar cell.

In another alternative embodiment of the present invention, the selected hindered amine light stabilizer is added in an amount in the range of 0.1 to 0.5 parts per hundred parts by weight of ethylene-vinyl acetate copolymer and the curing agent is added in an amount equivalent to 1.5 parts per hundred parts ethylene-vinyl acetate copolymer.

The present invention includes a method of producing an encapsulant for a solar cell. This method includes mixing one of the two above-mentioned hindered amine light stabilizers with an ethylene-vinyl acetate copolymer, a curing agent and, optionally, a primer. Then, the method includes applying the mixture to the solar cell and curing the applied mixture to form a thermoset encapsulant for the solar cell. Alternatively, if the selected hindered amine light stabilizer is O,O-t-Amyl-O-(1,2,2,6,6-Pentamethyl-4-piperidinyl) mono-peroxycarbonate, the curing agent need not be included.

The present invention also includes the product produced by the above method. This product is a cured, transparent encapsulant for a solar cell and includes a cross-linked ethylene-vinyl acetate copolymer and a hindered amine light stabilizer selected from the group consisting of O,O-t-Amyl-O- (1,2,2,6,6-Pentamethyl-4-piperidinyl) mono-peroxycarbonate or Poly[(4-hydroxy-2,2,6,6-tetramethyl-1-piperidine-ethanol) -co-dimethyl succinate].

BRIEF DESCRIPTION OF THE DRAWINGS

FIGS. 1 through 6 plot the time it takes for the optical transmission to degrade to a particular value at a specified wavelength.

DESCRIPTION OF THE INVENTION

Figure 1:
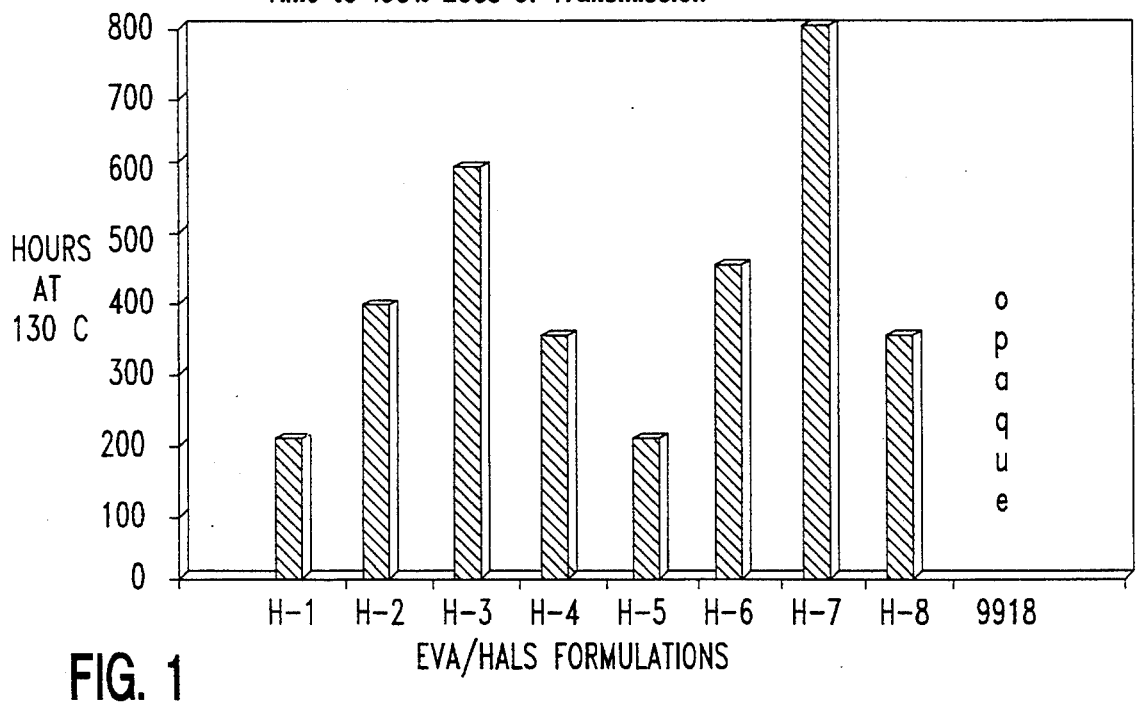

This invention is directed to a composition for minimizing the discoloration in an encapsulant for a solar cell. The composition includes an ethylene-vinyl acetate (EVA) copolymer, a curing agent and a hindered amine light stabilizer selected from the group consisting of O,O-t-Amyl-O- (1,2,2,6,6-Pentamethyl -4-piperidinyl) mono-peroxycarbonate or Poly [(4-hydroxy-2,2,6,6-tetramethyl-1-piperidine-ethanol) -co-dimethyl succinate]. Alternatively, if the selected hindered amine light stabilizer is 0,0-t-Amyl-O-(1,2,2,6,6-Pentamethyl-4-piperidinyl) mono-peroxycarbonate, the curing agent need not be included. This composition is cured and the subsequently formed product shows improved resistance to thermal discoloration.

Ethylene-vinyl acetate copolymer, commonly known in the art as EVA, refers to a whole class of polymers (or "resins") which are generally used to improve adhesion properties of hot-melt and pressure sensitive adhesives. One particular use of EVA is as an encapsulant for a solar cell.

In the present invention, the EVA copolymer used may be any EVA copolymer known in the art for this particular use. Preferably, the EVA copolymer has a vinyl acetate content between 25% and 35%. One such EVA copolymer which can be used in the present invention is sold under the trademark "ELVAX-150" by DuPont of Wilmington, Del.

A formulated version of the "ELVAX-150" EVA is "EVA A-9918", which contains the required curing agents and stabilizers necessary for solar module fabrication. In particular, the EVA-9918 formulation which is produced by Springborn Laboratories of Enfield, Conn. consists of the following mixture:

|  | "phr" |
|---|---|
| ELVAX-150 EVA (DuPont) | 100.0 |
| LUPERSOL-101 Peroxide (Atochem) | 1.5 |
| CYASORB UV-531 (Am. Cyanamide) | 0.3 |
| NAUGARD-P (Uniroyal) | 0.2 |
| TINUVIN-770 (Ciba-Geigy) | 0.1 |

Other suitable formulations are made by Richmond Industries of Redland Ca.; Bridgestone Tire & Rubber of Tokyo, Japan; and Etimex Gmbh of Germany. An additional modification of this compound, designated A-9918-P includes the primer "Z-6030" at a level of 0.25 phr. Springborn Laboratories also produces "EVA 15295" also known as the "fast cure" version, in which the LUPERSOL-101 peroxide curing agent is replaced by LUPERSOL-TBEC.

The curing agent used in the present invention may be any curing agent known in the art. A purpose of the curing agent is to serve to sufficiently cross-link the EVA during the cure cycle. The cured encapsulant should be a thermoset compound so that the integrity of the solar cell is not breached when exposed to heat. Two curing agents which have been used with successful results are 2,5-Dimethyl-2,5-Di-t-Butylperoxyhexane, which is sold under the trademark "LUPERSOL 101", and O,O-t-Butyl-O-(2-ethylhexyl) mono-peroxycarbonate, which is sold under the trademark "LUPERSOL TBEC" by Atochem of Buffalo, N.Y.

The amount of curing agent used may vary widely depending on the particular application. In experiments disclosed in the examples below, the amount of curing agent added was 1.5 parts per hundred parts of the EVA resin "ELVAX-150". The designation "phr" will be used hereinafter to indicate parts per hundred parts of the EVA copolymer.

One embodiment of the invention is directed to a composition for minimizing thermal discoloration in an EVA encapsulant. This composition includes an EVA copolymer, a curing agent and a discoloration stabilizer (one of the two particularly well-suited hindered amine light stabilizers discussed in more detail below).

According to another embodiment of the invention, a primer is also added to serve to enhance adherence of the encapsulant to the solar cell. The primer used in the present invention may be any primer known in the art.

Primers well known in the state-of-the-art include compounds in the broad class of chemistry known as "organo-silanes". Chemically, this group of primers may be represented by the formula (R—O)$_3$—Si—(C$_3$H$_6$)—R'. Primers useful in EVA encapsulant formulas have two chemically functional parts, R and R'. The first ("R") is the part that reacts with glass, solar cells and other inorganic surfaces. "R" may be methyl (CH$_3$—), ethyl (CH$_3$CH$_2$—), or acetyl (CH$_3$—CO—) The other functional part, R', reacts with the EVA polymer during the cure and may be any of the following chemical groups: methacrylate, acrylate, vinyl, maleate, itaconate, cinnamate or any other chemical group in which a double bonded carbon structure is available for free-radical attack.

One primer which may be used is gamma-Methacryloxypropyl trimethoxysilane, which is sold under the trademark "Z-6030" by Dow Corning of Midland Mich. The amount of primer used may vary widely depending on the particular application. In various experiments with successful results, the amount of primer used varied from 0.1 to 1.0 phr.

The final element of the composition of the present invention is a hindered amine light stabilizer (also known as "HALS") selected from the group consisting of O,O-t-Amyl-O-(1,2,2,6,6-Pentamethyl-4-piperidinyl) mono-peroxycarbonate and Poly[(4-hydroxy-2,2,6,6-tetramethyl-1-piperidine-ethanol) -co-dimethyl succinate]. The complete chemical characteristics of these two compounds, along with other tested HALS compounds, are disclosed on the attached Table 1. As indicated on Table 1, these two HALS compounds are respectively sold under the trademarks "LUPERSOL-HA-505" by Atochem and "TINUVIN 622LD" by Ciba-Geigy Corporation of Hawthorne, N.Y.

As indicated from Table I, the LUPERSOL HA-505 HALS actually represents O,O-t-Amyl-O-(1,2,2,6,6-Pentamethyl-4-piperidinyl) mono-peroxycarbonate in a fifty percent mixture with a solvent sold under the trademark "AROMATIC-100" solvent by Shell Chemical Corporation. The "AROMATIC-100" solvent by Shell Chemical Corporation consists primarily of meta-xylene, para-xylene, ethyl benzene and similar compounds. It is formulated to be a non-oxygenated high boiling point solvent for compatibility with acrylic polymers for automotive topcoats.

TABLE 1
COMMERCIAL HINDERED AMINE LIGHT STABILIZERS
("HALS" Type Stabilizers)

| Compound | Chemistry |
|---|---|
| Ciba-Geigy Corporation Hawthorne, NY | |
| 1. Tinuvin 770 | Bis-(Tetramethyl piperidinyl sebacate) m.w. = 481, m.p. = 84° C., pKb = 5.0, pKa = 9.0 TMP = 63% |
| 2. Tinuvin 123 | Bis-(N-octyloxy-tetramethyl piperidinyl sebacate), liquid, bp. = 367 C. at 760 mm; mw. = 737.2; pKb = 9.6; pKa = 4.2. TMP = 41.2% Low basicity, claimed to be synergistic w/ benzotriazole UV absorbers. |
| 3. Tinuvin 622D | Poly(4-hydroxy-tetramethyl piperidino-dimethyl succinate), m.w. = (283)$_n$, Mn = >2500, m.p. = 60° C., pKa = 6.5, TMP = 53.7% |
| 4. Chimassorb 944FL | Complex polymer of s-triazine with (tetramethyl-piperidinyl) amino adipate m.w. = (579)$_n$, Mn = >2500, m.p. = 55–70° C. pKa = 9.7, TMP = 52.5% |
| American Cyanamid Bridgewater, New Jersey | |
| 1. Cyasorb UV-3346 | Oligomer of N,N'-Bis(tetramethyl piperidinyl) 1,6-hexanediamine w/ dichloromorpholinyl-triazine. M.W = appx. 1600, m.p. = 110° C.–130° C. Moderately strong base. Recommended for EVA, and olefins requiring extended weatherability. |
| 2. Cyasorb UV-3581 | Proprietary HALS (liquid), mw. = 406.6, b.p. = 212° C./0.7 torr. Moderately strong base, pH = 8.1 |
| 3. Cyasorb UV-3604 | Dodecyl-N-(1,2,2,6,6-pentamethyl-4-piperidinyl)-succinimide (liquid), mw. = 420.66, bp. = 220 C./0.7 torr; pH = 7.5, TMP = 72.3% |
| 4. Cyasorb UV-3668 | Proprietary experimental HALS (liquid), mw. = 448.67, b.p. = n/a, pH = n/a |

TABLE 1-continued

COMMERCIAL HINDERED AMINE LIGHT STABILIZERS ("HALS" Type Stabilizers)

| Compound | | Chemistry |
|---|---|---|
| | | Low basicity |
| | | Atochem/Lucidol (previously Pennwalt Corporation) Buffalo, New York |
| 1. | Lupersol HA-505 | (Pentamethyl-4-piperidinyl)-O,O-t-Amyl-monoperoxy carbonate, assay: 50%, remainder "Aromatic 100" solvent. Liquid, 32° F. storage required. M.W. = 301, m.p. −13° F. |
| 2. | Luchem HA-B-HMPA | TMP = 50.4% Reactive with polymers; chemically binds HALS group. (Tetramethyl piperidinyl)-methyl phthalimido-oxamide. NOT reactive with polymer, but has powerful metal deactivation properties; m.w. = 392, m.p. = 115° C., TMP = 38.7% |

Note:
"TMP" indicates the weight percent of the compound that is the active tetramethyl piperidinyl group; the basis if HALS stabilization chemistry.
*Material Safety Data Sheets (MSDS) are available for all the compounds investigated in this study.

Before the utility of these two HALS compounds was discovered, an analysis of the causes of encapsulant discoloration was performed. An initial assumption was made that thermal exposure, which is an unavoidable condition for a solar cell, is the dominant stress on the encapsulation system.

Although light induced reactions may also aggravate degradation, they are more difficult to incorporate into test chambers, and much more difficult to interpret. Regardless of the relative importance between thermal discoloration and photo discoloration, it can be said that an encapsulant in accordance with the present invention reduces overall discoloration by reducing the discoloration from exposure to heat.

It was discovered that the thermal discoloration of EVA is strongly catalyzed by the presence of oxygen. Therefore, compounds which interfere with oxygen radical reactions should improve the stability of the EVA. Some of the known causes of degradation of EVA polymers are shown below on Table 2.

TABLE 2

GENERALIZED EVA DEGRADATION PATHWAYS

Path 1. Conjugation: (discoloration)

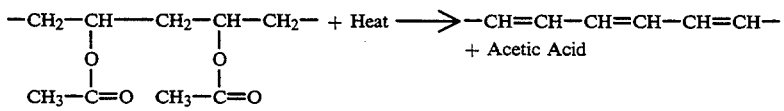

Path 2. Absorption/Excitation:

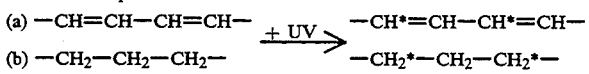

Path 3. Free-radical Formation:

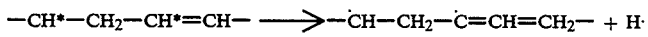

Path 4. Reactions with Oxygen (Peroxidation):

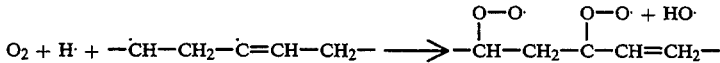

Path 5. Hydroperoxidation:

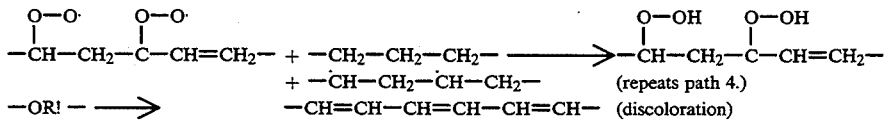

Path 6. Hydroperoxide Scission/Free-Radical Generation:

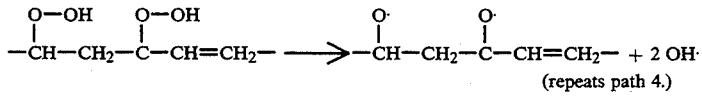

Path 7. Norrish Degradation:

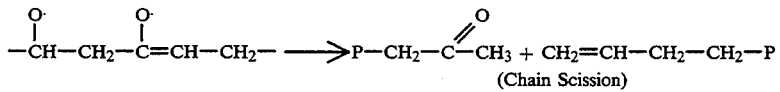

(Chain Scission)

Although Table 2 represents a highly generalized scheme, it does provide some useful guidance. For example, the reactions of all seven paths are interactive with each other and may either increase or decrease their respective rates, as well as cause each other to repeat. These reactions may, therefore, be competitive.

As stated above, one of the key discoveries is that the thermal discoloration of EVA is strongly catalyzed by the presence of oxygen. Accordingly, several HALS compounds, which are powerful antioxidants and free radical traps, were studied to determine their effect on discoloration.

HALS compounds are a class of compounds, known in the art, which are used specifically for the purpose of stabilizing polymers. They are usually tertiary amines, but in some cases may be secondary amines. HALS compounds are effective compounds for interrupting a number of pathways of thermal degradation. For example, HALS compounds interrupt Path 3 (of Table 2) by radical scavenging, Path 2 by excited state quenching and Path 6 by peroxide decomposition. Additionally, HALS compounds offer the following advantages:

1. HALS compounds do not interfere with the cure chemistry of EVA;
2. Very high concentrations of HALS compounds are possible for maximum lifetime;
3. HALS compounds have very high "molar efficiency" as antioxidants;
4. HALS compounds are non-sacrificial and regenerate themselves in a cyclical process, known in literature as the Denisov Cycle, as discussed below;
5. There may be a synergistic behavior of certain UV screening additives, in which the UV screen is protected by the HALS compound; and
6. Most HALS compounds have low volatility and two compounds (one for EVA) are available that will chemically graft to the polymer backbones during cure.

Regarding item 4, HALS compounds, as free radical scavengers, participate in a cyclic chemical process in which they regenerate themselves. The mechanism of stabilization and regeneration is still disputed, but a general theoretical model appears to be correct. This theoretical model indicates that the hindered amine (>N—H) oxides form nitroxyl radicals (>N—O·), which in turn react with polymer free-radicals (P·) to form an amine-ether, thereby terminating the radical reaction. The amine-ether then goes on to decompose polymer-bound peroxy radicals, terminating another degradation reaction and regenerating the nitroxyl group again. The nitroxyl group then repeats this process, which is known as the Denisov cycle (as modified by Klemchuck) shown as follows in Table 3:

TABLE 3

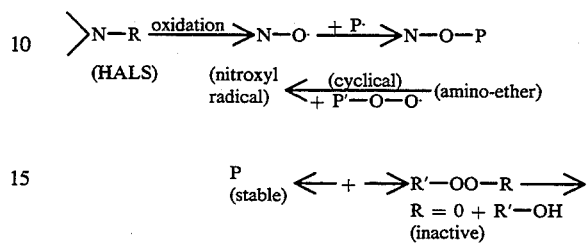

HALS compounds are available as low molecular weight compounds, polymers, and as co-reactive compounds. The source and description of some HALS which were tested is given in Table 1, with some chemical structures being shown in Table 4. Commercially available compounds vary in: (a) molecular weight, (b) base strength (pH), and (c) the ability to graft to the polymer backbone.

TABLE 4
CHEMICAL STRUCTURES
HINDERED AMINE LIGHT STABILIZERS

Tinuvin 144

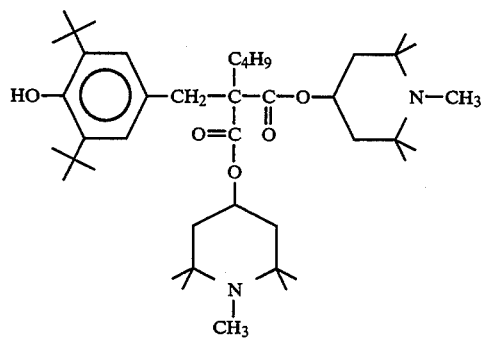

Tinuvin 770

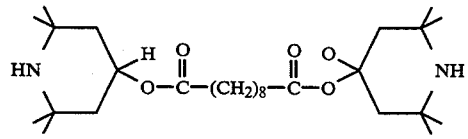

Tinuvin 765

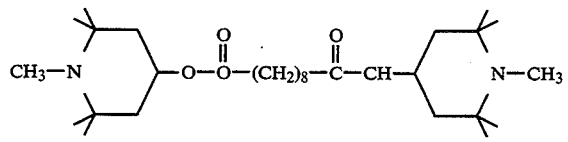

Tinuvin 123

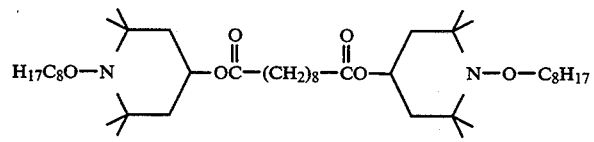

TABLE 4-continued
CHEMICAL STRUCTURES
HINDERED AMINE LIGHT STABILIZERS Tinuvin 622 D

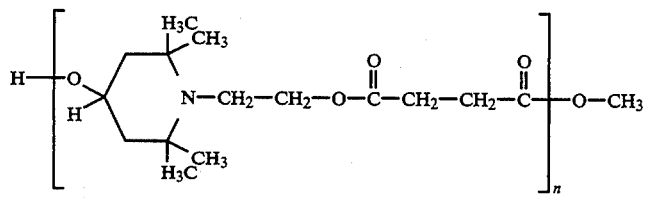

Chimassorb 944FL

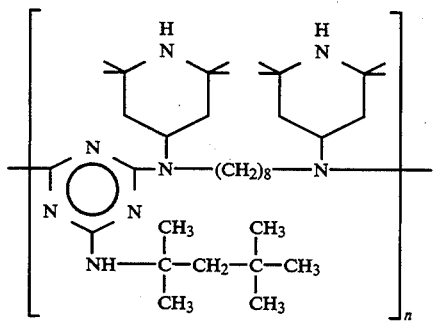

Lupersol HA-505

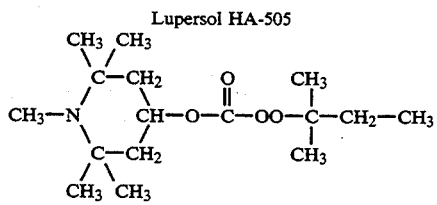

LUCHEM HA-B-HMPA

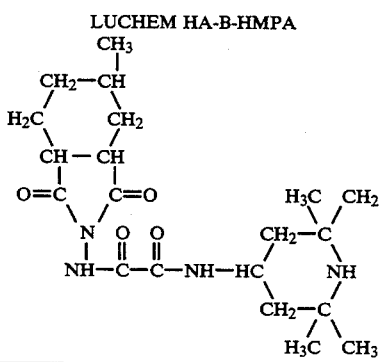

The molecular weight of the HALS compound controls volatility, solubility and diffusion. The rate of diffusion frequently correlates to the effectiveness of the antioxidants, as it must diffuse to the chemical site where it is needed. This normally limits the effectiveness of chemically bound additives; however, some recent work on polymer bound HALS compounds shows some improvement over monomeric species, especially in combination with phenolic type antioxidants.

The basicity (pH, or correctly, pKa) of HALS compounds is now believed to have a strong influence on stabilization. Strongly basic HALS compounds may have an antagonistic reaction with acidic components in polymer formulations. Lower basicity means less interaction with protonated species (acids). Strongly basic HALS compounds in acidic environments may protonate at the amine nitrogen and form inactive quarternary ammonium salts, with no stabilizing activity at all. However, tests confirming this hypothesis have not yet been conducted.

Only one HALS compound that may reactively combine with EVA is available, manufactured by Atochem Corporation, Buffalo, New York. This chemical compound is sold under the trademark "LUPERSOL HA-505", and is shown in Tables 1 and 4. This material likely reacts with EVA during cure to give a polymerically bound stabilizer.

The second reactive HALS, sold under the trademark "LUCHEM HA-RiO0", is designed to react only with maleate modified resins and is consequently of no use in EVA systems. It is the basis of a related compound, however, sold under the trademark "HA-B18" which is designed to be compatible with other polyolefins. It may be of possible benefit in EVA resins.

A caution is that the evaluation of HALS stabilizers by certain accelerated aging devices, e.g. lamps, may underrate their performance. This may be due to an unrealistically large number of radicals being generated which may kinetically "swamp" the stabilizer. For accuracy, these stabilizers should be evaluated by actual field trials. Due to the differing kinetic rates of radical termination, a mixture of two HALS may even be desirable. One may function better at higher temperatures, and the other more effectively at lower temperatures.

The method of encapsulating a solar cell according to the present invention involves first mixing the elements together. The elements include an EVA copolymer, a curing agent and an HALS. Alternatively, if the selected hindered amine light stabilizer is O,O-t-Amyl-O-(1,2,2,6,6-Pentamethyl-4-piperidinyl) mono-peroxycarbonate, the curing agent need not be included. These are incorporated by conventional milling and compounding operations as are other additives. Then, this mixture is applied to a solar cell in a conventional manner, such as by molding. Finally, the applied mixture is cured by heat. The particular steps of the method are discussed in more detail below in Example 1.

The present invention is more clearly demonstrated by the following Examples.

EXAMPLE 1

In order to determine how various HALS compounds would minimize encapsulant discoloration, several compounds from Table 1 were selected, mixed with an EVA copolymer and thermally aged.

In particular, eight EVA formulations were prepared with seven of the HALS compounds considered to be the most promising. An eighth formulation consisted of a mixture of two HALS compounds to explore the possibility of synergism. All HALS compounds were incorporated at the 0.1 phr level, and the formulations are shown in Table 5.

TABLE 5

HALS/EVA STABILIZER FORMULATIONS
Formulations per 100 gm Elvax 150[a]
(based on 0.1 phr HALS compound)

|  | H-1 | H-2 | H-3 | H-4 | H-5 | H-6 | H-7 | H-8 |
|---|---|---|---|---|---|---|---|---|
| Tinuvin 770 | 0.1 | — | — | — | — | — | — | .05 |
| Tinuvin 123 | — | 0.1 | — | — | — | — | — | — |
| Tinuvin 622[D] | — | — | 0.1 | — | — | — | — | — |
| Chimassorb 944 | — | — | — | 0.1 | — | — | — | .05 |
| Cyasorb UV-3346 | — | — | — | — | 0.1 | — | — | — |
| Cyasorb UV-3604 | — | — | — | — | — | 0.1 | — | — |
| Lupersol HA-505[c] | — | — | — | — | — | — | 0.1 | — |
| Cured with: Lupersol-101 | 1.5 | 1.5 | 1.5 | 1.5 | 1.5 | 1.5 | 1.5 | 1.5 |
| Swell Index:[b] | 14.9 | 11.5 | 11.7 | 11.3 | 15.4 | 8.8 | 13.6 | 11.6 |
| Gel Content:[b] | 88% | 91% | 89% | 91% | 88% | 91% | 89% | 92% |

[a]Compounded in 375 gm batches on a Bemco 6 × 12 differential mill, maximum temperature 40° C.
[b]Formulations compression molded and cured at 150° C./12 minutes, extracted in toluene at 60° C./18 hours.
[c]Known to be a 50% solution in "Aromatic 100" solvent; actual amount of active ingredient is therefore one half that of other stabilizers!

These formulations of EVA containing the various selected heat stabilizers were prepared with 1.5 phr of "LUPERSOL-101" curing agent and 0.1 phr of the thermal stabilizer. (Note: "phr" is a standard term meaning Parts per Hundred parts EVA Resin). Pre-weighed batches of "ELVAX-150" EVA were compounded on a differential two-roll mill starting at room temperature. The rubber was banded, and the stabilizer and peroxide were added over a five minute period of time during which the batch shear heated to approximately 40° C.

Plaques of the trial formulations were then compression molded and checked for cure compatibility. This was done by determining both the swell index and gel content in hot toluene. Gel content is defined as the percent by weight of dry resin remaining after a cured sample is extracted by a suitable solvent (in this case, toluene). This test is a measure of how well the EVA cures in the presence of an additive that might affect the cure chemistry. All gel content values are over 80%, which indicates an acceptable degree of cure, and also indicates that the additive is acceptable for use in further formulation.

Swell Index is defined as the number of times the weight increases when a cured resin sample is immersed in a suitable solvent. Very high swell index values indicate that the cured resin is held together by a small number of bonds. A low swell index, which is preferable, indicates that many chemical bonds have formed in the curing process. A swell index of less than about 20% indicates that the composition has an acceptable level of "crosslink" bonds. These values are shown in Table 5. The swell index values were all below 20%, indicating an acceptable level of "crosslink" bonds.

Compression molded (and cured) sheets were then heat laminated to squares (2.5"×2.5") of pure optical grade silica to give specimens suitable for spectroscopy into the ultraviolet range. Only one side was laminated to permit the polymer to be exposed to air on the other side. Plain "ELVAX-150" EVA (cross-linked with "LUPERSOL-101" curing agent) was included as a control.

The silica laminates were placed in Petri dishes and then loaded into a circulating air oven at 130° C. for specific periods of time. The progress of thermal discoloration (formation of conjugated double bonds) was followed by Ultraviolet/visible (UV/Vis) spectroscopy over the range of 250 to 500 nm. (Note: "nm" is a nanometer, equal to $10^{-9}$ meters, or 10 Angstroms.) The terrestrial limit of sunlight is 300 nm; however, recording spectra at lower wavelengths was done to determine if early signs of chemical change were apparent in the low wavelength ranges. Mounting the EVA/HALS formulations to silica slides permitted these lower UV wavelengths to be measured.

Changes in absorbance and coloration were measured as percent transmission at specific wave lengths (Table 6) and as percentage of the one hour base values (Table 7). Table 7 provides a more useful basis of comparison between the formulations. Additional degradation kinetics were established using a control specimen of pure (cross-linked) EVA laminated to silica glass.

UV/Vis spectroscopy was run at regular intervals and the percent transmission measured over the range from 260 nm to 500 nm in 10 nm intervals. Short intervals were used at first to determine early changes, then long intervals were used to determine the best stabilization formulation. This resulted in the accumulation of over 2,100 measurements.

TABLE 6

THERMAL AGING, PERCENT TRANSMISSION
HALS Formulations
Thermal Aging at 130 C.

PERCENT TRANSMISSION
Wavelength, nanometers

| Hours | 260 | 280 | 300 | 320 | 340 | 360 | 380 | 400 | 420 | 440 | 460 | 480 | 500 |
|---|---|---|---|---|---|---|---|---|---|---|---|---|---|
| H-1 | | | | | | | | | | | | | |
| 0 | 1.0 | 21.0 | 44.0 | 59.0 | 68.0 | 73.0 | 75.0 | 76.0 | — | — | — | — | — |
| 1 | 1.0 | 17.0 | 40.0 | 58.0 | 70.0 | 76.0 | 79.0 | 81.0 | 83.0 | 83.0 | 84.0 | 84.0 | 84.0 |
| 4 | 0.0 | 9.0 | 29.0 | 51.0 | 65.0 | 73.0 | 77.5 | 80.0 | 82.0 | 82.5 | 83.0 | 83.5 | 84.0 |
| 10 | 0.0 | 4.0 | 20.0 | 45.0 | 60.0 | 70.5 | 76.0 | 79.0 | 80.5 | 81.5 | 82.0 | 83.0 | 83.0 |
| 25 | 0.0 | 1.0 | 13.0 | 36.0 | 53.0 | 64.0 | 70.0 | 72.0 | 72.0 | 71.0 | 79.0 | 67.0 | 65.0 |
| 50 | 0.0 | 0.0 | 5.0 | 23.0 | 41.0 | 57.0 | 66.0 | 72.0 | 74.5 | 76.0 | 77.0 | 78.0 | 78.0 |
| 100 | 0.0 | 0.0 | 1.0 | 8.0 | 20.0 | 37.0 | 51.0 | 60.0 | 65.0 | 69.0 | 71.0 | 73.0 | 74.0 |
| 150 | 0.0 | 0.0 | 0.0 | 3.0 | 10.0 | 24.0 | 40.0 | 54.0 | 64.0 | 70.0 | 74.0 | 76.0 | 78.0 |
| 200 | 0.0 | 0.0 | 0.0 | 0.0 | 3.0 | 10.0 | 21.0 | 35.0 | 47.0 | 57.0 | 63.0 | 68.0 | 72.0 |
| 250 | 0.0 | 0.0 | 0.0 | 0.0 | 0.0 | 3.0 | 9.0 | 19.0 | 29.0 | 39.0 | 47.0 | 54.0 | 59.0 |
| 300 | 0.0 | 0.0 | 0.0 | 0.0 | 1.0 | 3.0 | 8.0 | 18.0 | 30.0 | 41.0 | 50.0 | 58.0 | 64.0 |
| 350 | 0.0 | 0.0 | 0.0 | 0.0 | 0.0 | 2.0 | 5.0 | 14.0 | 23.0 | 34.0 | 44.0 | 52.0 | 57.0 |
| 400 | 0.0 | 0.0 | 0.0 | 0.0 | 0.0 | 3.0 | 5.0 | 12.0 | 21.0 | 31.0 | 41.0 | 48.0 | 75.0 |
| 450 | 0.0 | 0.0 | 0.0 | 0.0 | 0.0 | 0.0 | 1.0 | 3.0 | 9.0 | 17.0 | 26.0 | 34.0 | 41.0 |
| 500 | 0.0 | 0.0 | 0.0 | 0.0 | 0.0 | 1.0 | 2.0 | 7.0 | 15.0 | 24.0 | 33.0 | 42.0 | 49.0 |
| 600 | 0.0 | 0.0 | 0.0 | 0.0 | 0.0 | 0.0 | 1.0 | 3.0 | 8.0 | 15.0 | 24.0 | 33.0 | 41.0 |
| 700 | 0.0 | 0.0 | 0.0 | 0.0 | 0.0 | 0.0 | 1.0 | 3.0 | 8.0 | 15.0 | 23.0 | 31.0 | 38.0 |
| 800 | 0.0 | 0.0 | 0.0 | 0.0 | 0.0 | 0.0 | 0.0 | 2.0 | 6.0 | 12.0 | 20.0 | 28.0 | 36.0 |
| 900 | 0.0 | 0.0 | 0.0 | 0.0 | 0.0 | 0.0 | 0.0 | 1.5 | 4.0 | 19.0 | 16.0 | 24.0 | 31.0 |
| 1000 | 0.0 | 0.0 | 0.0 | 0.0 | 0.0 | 0.0 | 0.0 | 1.0 | 3.0 | 6.5 | 11.0 | 15.0 | 19.0 |
| H-2 | | | | | | | | | | | | | |
| 0 | 1.5 | 23.0 | 44.0 | 58.5 | 67.0 | 71.0 | 73.0 | 75.0 | — | — | — | — | — |
| 1 | 1.0 | 17.0 | 37.0 | 55.0 | 65.0 | 71.0 | 74.0 | 76.0 | 77.0 | 78.0 | 78.5 | 79.0 | 79.0 |
| 4 | 0.0 | 8.0 | 27.0 | 48.0 | 60.0 | 68.0 | 72.0 | 75.0 | 76.0 | 77.0 | 78.0 | 78.0 | 79.0 |
| 10 | 0.0 | 4.0 | 20.0 | 43.0 | 57.0 | 66.0 | 71.0 | 74.0 | 76.0 | 77.0 | 77.5 | 78.0 | 79.0 |
| 25 | 0.0 | 2.0 | 15.0 | 37.0 | 52.0 | 62.5 | 68.0 | 72.0 | 73.0 | 73.0 | 75.0 | 75.0 | 76.0 |
| 50 | 0.0 | 0.0 | 9.0 | 29.0 | 46.0 | 60.0 | 67.0 | 71.5 | 74.0 | 75.0 | 76.0 | 77.0 | 77.0 |
| 100 | 0.0 | 0.0 | 3.0 | 17.0 | 33.0 | 49.0 | 60.0 | 66.0 | 69.5 | 72.0 | 73.0 | 74.0 | 75.0 |
| 150 | 0.0 | 0.0 | 1.5 | 11.0 | 25.0 | 40.0 | 52.5 | 61.0 | 65.0 | 68.0 | 70.0 | 70.0 | 70.0 |
| 200 | 0.0 | 0.0 | 0.0 | 7.0 | 17.0 | 34.0 | 49.0 | 61.0 | 68.0 | 73.0 | 75.0 | 77.0 | 78.0 |
| 250 | 0.0 | 0.0 | 0.0 | 3.0 | 8.0 | 19.0 | 32.0 | 44.0 | 54.0 | 60.0 | 64.0 | 67.0 | 69.0 |
| 300 | 0.0 | 0.0 | 0.0 | 1.5 | 5.0 | 14.0 | 26.0 | 39.0 | 49.0 | 57.0 | 62.5 | 66.0 | 69.0 |
| 350 | 0.0 | 0.0 | 0.0 | 1.0 | 3.0 | 9.0 | 19.0 | 32.0 | 43.0 | 52.0 | 59.0 | 64.0 | 67.0 |
| 400 | 0.0 | 0.0 | 0.0 | 0.0 | 2.0 | 6.0 | 14.0 | 26.0 | 38.0 | 47.0 | 55.0 | 61.0 | 65.0 |
| 450 | 0.0 | 0.0 | 0.0 | 0.0 | 1.0 | 5.0 | 12.0 | 22.0 | 34.0 | 43.0 | 51.0 | 57.0 | 62.0 |
| 500 | 0.0 | 0.0 | 0.0 | 0.0 | 1.0 | 4.0 | 10.0 | 20.0 | 31.0 | 42.0 | 46.0 | 57.0 | 62.0 |
| 600 | 0.0 | 0.0 | 0.0 | 0.0 | 0.0 | 2.0 | 6.0 | 14.0 | 24.0 | 34.0 | 43.0 | 51.0 | 57.0 |
| 700 | 0.0 | 0.0 | 0.0 | 0.0 | 0.0 | 0.0 | 2.5 | 8.0 | 18.0 | 31.0 | 43.0 | 53.0 | 60.0 |
| 800 | 0.0 | 0.0 | 0.0 | 0.0 | 0.0 | 0.0 | 3.0 | 9.0 | 17.0 | 26.0 | 36.0 | 44.0 | 51.0 |
| 900 | 0.0 | 0.0 | 0.0 | 0.0 | 0.0 | 0.0 | 2.0 | 7.0 | 15.0 | 24.0 | 33.0 | 41.0 | 49.0 |
| 1000 | 0.0 | 0.0 | 0.0 | 0.0 | 0.0 | 1.0 | 2.0 | 6.5 | 14.0 | 23.0 | 32.0 | 41.0 | 48.0 |
| H-3 | | | | | | | | | | | | | |
| 0 | 1.0 | 23.0 | 44.0 | 58.0 | 67.0 | 71.0 | 73.0 | 75.0 | — | — | — | — | — |
| 1 | 1.0 | 17.0 | 37.0 | 54.0 | 66.0 | 72.0 | 75.5 | 77.5 | 79.0 | 79.5 | 80.0 | 80.0 | 80.0 |
| 4 | 0.0 | 8.0 | 27.0 | 50.0 | 65.0 | 74.0 | 79.0 | 82.0 | 83.0 | 84.0 | 84.0 | 84.5 | 85.0 |
| 10 | 0.0 | 3.5 | 20.0 | 43.0 | 60.0 | 71.0 | 76.5 | 79.5 | 81.0 | 82.0 | 82.0 | 82.5 | 83.0 |
| 25 | 0.0 | 1.5 | 12.0 | 34.0 | 50.0 | 62.5 | 69.0 | 72.0 | 72.0 | 75.0 | 75.5 | 76.0 | 76.0 |
| 50 | 0.0 | 0.0 | 6.0 | 25.0 | 43.0 | 58.0 | 67.0 | 72.0 | 75.0 | 76.0 | 77.0 | 79.0 | 79.0 |
| 100 | 0.0 | 0.0 | 3.0 | 17.0 | 34.0 | 52.0 | 64.0 | 71.0 | 74.0 | 76.5 | 78.0 | 79.0 | 79.0 |
| 150 | 0.0 | 0.0 | 2.0 | 12.0 | 28.0 | 46.0 | 60.0 | 68.0 | 72.0 | 74.0 | 76.0 | 77.0 | 78.0 |
| 200 | 0.0 | 0.0 | 0.0 | 7.0 | 19.0 | 37.0 | 51.0 | 60.5 | 66.0 | 69.0 | 71.5 | 73.0 | 74.0 |
| 250 | 0.0 | 0.0 | 0.0 | 5.0 | 15.0 | 30.0 | 45.0 | 56.0 | 63.0 | 67.0 | 71.0 | 72.0 | 74.0 |
| 300 | 0.0 | 0.0 | 0.0 | 4.0 | 12.0 | 27.0 | 43.0 | 55.0 | 64.0 | 69.0 | 72.0 | 74.0 | 76.0 |
| 350 | 0.0 | 0.0 | 0.0 | 2.0 | 9.0 | 22.0 | 37.0 | 50.0 | 59.0 | 65.0 | 69.5 | 72.0 | 74.0 |
| 400 | 0.0 | 0.0 | 0.0 | 0.0 | 6.0 | 17.0 | 31.0 | 44.0 | 53.0 | 60.0 | 65.0 | 68.0 | 70.0 |
| 450 | 0.0 | 0.0 | 0.0 | 1.0 | 6.0 | 16.0 | 30.0 | 45.0 | 55.5 | 64.0 | 69.0 | 72.0 | 75.0 |
| 500 | 0.0 | 0.0 | 0.0 | 1.0 | 4.0 | 13.0 | 26.0 | 40.0 | 51.0 | 60.0 | 66.0 | 69.5 | 72.0 |
| 600 | 0.0 | 0.0 | 0.0 | 0.0 | 2.0 | 9.0 | 20.0 | 33.0 | 45.0 | 54.0 | 61.0 | 65.0 | 69.0 |
| 700 | 0.0 | 0.0 | 0.0 | 0.0 | 1.0 | 7.0 | 17.0 | 30.0 | 43.0 | 52.0 | 60.0 | 65.0 | 68.0 |
| 800 | 0.0 | 0.0 | 0.0 | 0.0 | 1.0 | 5.0 | 13.0 | 25.0 | 36.0 | 47.0 | 54.0 | 60.0 | 65.0 |
| 900 | 0.0 | 0.0 | 0.0 | 0.0 | 1.0 | 3.0 | 10.0 | 21.0 | 32.0 | 42.0 | 51.0 | 52.0 | 62.0 |
| 1000 | 0.0 | 0.0 | 0.0 | 0.0 | 1.0 | 3.0 | 10.0 | 21.0 | 33.5 | 45.0 | 54.0 | 61.0 | 65.0 |
| H-4 | | | | | | | | | | | | | |
| 0 | 1.0 | 25.0 | 48.0 | 62.0 | 72.0 | 77.0 | 80.0 | 81.5 | — | — | — | — | — |
| 1 | 1.0 | 18.0 | 39.0 | 58.0 | 70.0 | 76.0 | 80.0 | 82.0 | 83.0 | 84.0 | 84.5 | 85.0 | 85.0 |
| 4 | 0.0 | 9.0 | 29.0 | 50.0 | 64.0 | 73.0 | 78.0 | 81.0 | 82.0 | 83.0 | 84.0 | 84.5 | 85.0 |
| 10 | 0.0 | 4.0 | 21.0 | 45.0 | 61.0 | 71.0 | 77.0 | 80.0 | 82.0 | 83.0 | 83.5 | 84.0 | 84.0 |
| 25 | 0.0 | 2.0 | 14.0 | 35.0 | 51.5 | 63.0 | 70.0 | 74.0 | 76.0 | 77.0 | 77.5 | 78.0 | 79.0 |
| 50 | 0.0 | 0.0 | 8.0 | 27.0 | 44.0 | 58.0 | 66.0 | 71.0 | 74.0 | 75.0 | 76.0 | 77.0 | 78.0 |
| 100 | 0.0 | 0.0 | 3.0 | 16.0 | 30.0 | 46.0 | 56.0 | 63.0 | 66.5 | 69.0 | 70.0 | 71.0 | 72.0 |
| 150 | 0.0 | 0.0 | 2.0 | 10.0 | 22.0 | 36.0 | 48.0 | 56.5 | 61.5 | 65.0 | 67.0 | 68.0 | 70.0 |
| 200 | 0.0 | 0.0 | 0.0 | 6.0 | 15.0 | 28.0 | 41.0 | 51.0 | 58.0 | 62.0 | 65.0 | 67.0 | 68.0 |
| 250 | 0.0 | 0.0 | 0.0 | 3.0 | 8.0 | 17.0 | 28.0 | 38.0 | 45.0 | 51.0 | 55.0 | 58.0 | 60.0 |

TABLE 6-continued

THERMAL AGING, PERCENT TRANSMISSION
HALS Formulations
Thermal Aging at 130 C.

PERCENT TRANSMISSION
Wavelength, nanometers

| Hours | 260 | 280 | 300 | 320 | 340 | 360 | 380 | 400 | 420 | 440 | 460 | 480 | 500 |
|---|---|---|---|---|---|---|---|---|---|---|---|---|---|
| 300 | 0.0 | 0.0 | 0.0 | 2.0 | 6.0 | 13.0 | 23.5 | 34.0 | 43.0 | 49.0 | 54.0 | 57.0 | 60.0 |
| 350 | 0.0 | 0.0 | 0.0 | 0.0 | 2.0 | 5.0 | 12.0 | 21.0 | 29.0 | 37.0 | 45.0 | 49.0 | 53.0 |
| 400 | 0.0 | 0.0 | 0.0 | 0.0 | 2.0 | 7.0 | 14.0 | 24.0 | 33.0 | 40.0 | 46.0 | 51.0 | 55.0 |
| 450 | 0.0 | 0.0 | 0.0 | 0.0 | 2.0 | 7.0 | 14.0 | 24.0 | 33.0 | 40.0 | 46.0 | 51.0 | 55.0 |
| 500 | 0.0 | 0.0 | 0.0 | 0.0 | 0.0 | 5.0 | 11.0 | 20.0 | 29.0 | 37.0 | 43.0 | 48.5 | 53.0 |
| 600 | 0.0 | 0.0 | 0.0 | 0.0 | 0.0 | 3.0 | 7.0 | 14.0 | 22.0 | 30.0 | 37.0 | 43.0 | 48.0 |
| 700 | 0.0 | 0.0 | 0.0 | 0.0 | 0.0 | 2.0 | 6.0 | 13.0 | 21.0 | 30.0 | 38.0 | 44.0 | 50.0 |
| 800 | 0.0 | 0.0 | 0.0 | 0.0 | 0.0 | 1.0 | 4.0 | 10.0 | 18.0 | 26.0 | 34.0 | 41.0 | 47.0 |
| 900 | 0.0 | 0.0 | 0.0 | 0.0 | 0.0 | 1.0 | 4.0 | 9.0 | 16.0 | 24.0 | 32.0 | 39.0 | 45.0 |
| 1000 | 0.0 | 0.0 | 0.0 | 0.0 | 0.0 | 1.0 | 3.0 | 8.0 | 15.0 | 23.0 | 31.5 | 39.0 | 45.0 |
| H-5 | | | | | | | | | | | | | |
| 0 | 1.0 | 21.0 | 48.0 | 62.0 | 70.0 | 74.5 | 77.0 | 79.0 | — | — | — | — | — |
| 1 | 0.5 | 14.0 | 33.0 | 49.0 | 60.0 | 66.0 | 70.0 | 73.0 | 74.5 | 76.0 | 77.0 | 77.5 | 78.0 |
| 4 | 0.0 | 5.0 | 21.0 | 40.0 | 54.0 | 62.0 | 67.0 | 71.0 | 73.0 | 74.0 | 75.0 | 76.0 | 76.0 |
| 10 | 0.0 | 3.0 | 17.0 | 38.0 | 54.0 | 64.0 | 60.0 | 74.0 | 76.0 | 77.0 | 78.0 | 79.0 | 79.0 |
| 25 | 0.0 | 1.0 | 10.0 | 27.0 | 42.0 | 54.0 | 61.0 | 66.0 | 68.0 | 70.0 | 71.0 | 72.5 | 73.0 |
| 50 | 0.0 | 0.0 | 3.0 | 16.0 | 30.0 | 43.0 | 53.0 | 59.0 | 63.0 | 66.0 | 68.0 | 69.0 | 70.0 |
| 100 | 0.0 | 0.0 | 1.0 | 8.0 | 18.0 | 31.0 | 42.0 | 50.0 | 56.0 | 60.0 | 63.0 | 66.0 | 67.0 |
| 150 | 0.0 | 0.0 | 0.0 | 4.0 | 11.0 | 20.0 | 30.0 | 38.0 | 45.0 | 50.0 | 54.0 | 57.0 | 59.0 |
| 200 | 0.0 | 0.0 | 0.0 | 0.0 | 6.0 | 14.0 | 24.0 | 34.0 | 43.0 | 49.0 | 54.0 | 57.0 | 60.0 |
| 250 | 0.0 | 0.0 | 0.0 | 0.0 | 3.0 | 7.0 | 14.0 | 23.0 | 30.0 | 37.0 | 42.0 | 47.0 | 51.0 |
| 300 | 0.0 | 0.0 | 0.0 | 0.0 | 2.0 | 7.0 | 15.0 | 24.0 | 33.0 | 41.0 | 48.0 | 53.0 | 57.0 |
| 350 | 0.0 | 0.0 | 0.0 | 0.0 | 0.0 | 3.0 | 8.0 | 15.0 | 23.0 | 30.0 | 37.0 | 44.0 | 48.0 |
| 400 | 0.0 | 0.0 | 0.0 | 0.0 | 0.0 | 2.0 | 6.0 | 12.0 | 19.0 | 27.0 | 34.0 | 40.0 | 45.0 |
| 450 | 0.0 | 0.0 | 0.0 | 0.0 | 0.0 | 3.0 | 8.0 | 15.0 | 24.0 | 33.0 | 40.0 | 46.0 | 51.0 |
| 500 | 0.0 | 0.0 | 0.0 | 0.0 | 0.0 | 1.0 | 4.0 | 8.0 | 15.0 | 22.0 | 29.0 | 36.0 | 41.0 |
| 600 | 0.0 | 0.0 | 0.0 | 0.0 | 0.0 | 1.0 | 3.0 | 7.0 | 12.0 | 19.0 | 25.0 | 32.0 | 37.0 |
| 700 | 0.0 | 0.0 | 0.0 | 0.0 | 0.0 | 1.0 | 3.0 | 8.0 | 14.5 | 23.0 | 31.0 | 39.0 | 45.0 |
| 800 | 0.0 | 0.0 | 0.0 | 0.0 | 0.0 | 0.0 | 2.0 | 5.0 | 19.0 | 15.0 | 21.0 | 28.0 | 34.0 |
| 900 | 0.0 | 0.0 | 0.0 | 0.0 | 0.0 | 0.0 | 1.0 | 4.0 | 7.0 | 13.0 | 20.0 | 27.0 | 33.0 |
| 1000 | 0.0 | 0.0 | 0.0 | 0.0 | 0.0 | 0.0 | 1.0 | 4.0 | 8.0 | 14.0 | 20.0 | 26.0 | 32.0 |
| H-6 | | | | | | | | | | | | | |
| 0 | 2.0 | 25.0 | 49.0 | 63.0 | 71.0 | 75.0 | 77.0 | 79.0 | — | — | — | — | — |
| 1 | 1.0 | 19.0 | 40.0 | 56.0 | 66.0 | 72.0 | 75.0 | 77.0 | 79.0 | 79.0 | 80.0 | 80.0 | 81.0 |
| 4 | 0.0 | 9.0 | 29.0 | 49.0 | 62.0 | 70.0 | 74.0 | 77.0 | 78.0 | 79.0 | 79.5 | 80.0 | 80.0 |
| 10 | 0.0 | 5.0 | 22.0 | 43.0 | 58.0 | 78.0 | 73.0 | 76.0 | 77.5 | 78.0 | 79.0 | 80.0 | 80.0 |
| 25 | 0.0 | 2.5 | 15.0 | 36.0 | 51.0 | 62.0 | 68.0 | 71.0 | 73.0 | 74.0 | 74.0 | 75.0 | 75.0 |
| 50 | 0.0 | 0.0 | 8.0 | 27.0 | 44.0 | 57.0 | 65.0 | 69.0 | 72.0 | 73.0 | 74.0 | 75.0 | 75.0 |
| 100 | 0.0 | 0.0 | 4.0 | 22.0 | 39.0 | 56.0 | 66.0 | 72.0 | 76.0 | 77.0 | 79.0 | 80.0 | 81.0 |
| 150 | 0.0 | 0.0 | 2.0 | 15.0 | 29.0 | 45.0 | 57.0 | 64.0 | 69.0 | 72.0 | 73.0 | 74.0 | 75.0 |
| 200 | 0.0 | 0.0 | 0.0 | 9.0 | 20.0 | 36.0 | 50.0 | 60.0 | 67.0 | 71.0 | 73.0 | 74.0 | 75.0 |
| 250 | 0.0 | 0.0 | 0.0 | 5.0 | 14.0 | 27.0 | 41.0 | 52.0 | 61.0 | 66.0 | 69.5 | 72.0 | 73.0 |
| 300 | 0.0 | 0.0 | 0.0 | 3.0 | 8.0 | 19.0 | 31.0 | 44.0 | 54.0 | 60.0 | 65.0 | 68.0 | 70.0 |
| 350 | 0.0 | 0.0 | 0.0 | 1.0 | 5.0 | 12.0 | 23.0 | 35.0 | 35.0 | 45.0 | 59.0 | 63.0 | 65.0 |
| 400 | 0.0 | 0.0 | 0.0 | 1.0 | 4.0 | 11.0 | 22.0 | 35.0 | 46.0 | 55.0 | 61.0 | 66.0 | 69.0 |
| 450 | 0.0 | 0.0 | 0.0 | 0.0 | 3.0 | 9.0 | 19.0 | 32.0 | 45.0 | 55.0 | 62.0 | 68.0 | 71.0 |
| 500 | 0.0 | 0.0 | 0.0 | 0.0 | 2.0 | 6.0 | 14.0 | 25.0 | 37.0 | 47.0 | 54.0 | 60.0 | 65.0 |
| 600 | 0.0 | 0.0 | 0.0 | 0.0 | 1.0 | 3.0 | 9.0 | 19.0 | 29.0 | 39.0 | 47.0 | 54.0 | 59.0 |
| 700 | 0.0 | 0.0 | 0.0 | 0.0 | 0.0 | 3.0 | 8.0 | 16.0 | 27.0 | 37.0 | 46.0 | 54.0 | 60.0 |
| 800 | 0.0 | 0.0 | 0.0 | 0.0 | 0.0 | 2.0 | 6.0 | 14.0 | 25.0 | 35.0 | 45.0 | 53.0 | 59.0 |
| 900 | 0.0 | 0.0 | 0.0 | 0.0 | 0.0 | 1.0 | 4.0 | 10.0 | 18.0 | 27.0 | 36.0 | 44.0 | 50.0 |
| 1000 | 0.0 | 0.0 | 0.0 | 0.0 | 0.0 | 1.0 | 4.0 | 9.0 | 18.0 | 28.0 | 38.0 | 46.0 | 53.0 |
| H-7 | | | | | | | | | | | | | |
| 0 | 1.0 | 23.0 | 52.0 | 66.0 | 74.0 | 79.0 | 81.0 | 83.0 | — | — | — | — | — |
| 1 | 1.0 | 18.0 | 39.0 | 55.0 | 67.0 | 73.0 | 76.0 | 78.0 | 79.5 | 80.0 | 81.0 | 81.0 | 82.0 |
| 4 | 0.0 | 8.0 | 26.0 | 45.0 | 59.0 | 67.0 | 72.0 | 75.0 | 76.0 | 77.5 | 78.0 | 79.0 | 79.0 |
| 10 | 0.0 | 5.0 | 22.0 | 43.0 | 59.0 | 68.5 | 74.0 | 77.0 | 78.5 | 79.0 | 80.0 | 80.0 | 81.0 |
| 25 | 0.0 | 2.0 | 13.0 | 34.0 | 48.0 | 59.0 | 65.0 | 69.0 | 71.0 | 72.0 | 73.0 | 74.0 | 74.0 |
| 50 | 0.0 | 0.0 | 8.0 | 27.0 | 43.0 | 57.0 | 65.0 | 69.0 | 71.0 | 73.0 | 74.0 | 75.0 | 75.0 |
| 100 | 0.0 | 0.0 | 3.5 | 18.0 | 35.0 | 50.0 | 60.0 | 66.0 | 69.0 | 70.0 | 72.0 | 73.0 | 74.0 |
| 150 | 0.0 | 0.0 | 2.0 | 14.0 | 30.0 | 46.0 | 58.0 | 64.0 | 68.0 | 70.0 | 72.0 | 73.0 | 74.0 |
| 200 | 0.0 | 0.0 | 0.0 | 12.0 | 27.0 | 46.0 | 59.0 | 67.0 | 71.0 | 74.0 | 75.0 | 76.0 | 77.0 |
| 250 | 0.0 | 0.0 | 0.0 | 6.0 | 16.0 | 31.0 | 44.0 | 53.0 | 58.0 | 62.0 | 64.0 | 66.0 | 67.0 |
| 300 | 0.0 | 0.0 | 0.0 | 6.0 | 17.0 | 35.0 | 50.0 | 61.0 | 67.0 | 72.0 | 74.0 | 76.0 | 77.0 |
| 350 | 0.0 | 0.0 | 0.0 | 4.0 | 12.0 | 28.0 | 43.0 | 55.0 | 62.0 | 66.5 | 70.0 | 71.0 | 73.0 |
| 400 | 0.0 | 0.0 | 0.0 | 3.0 | 11.0 | 26.0 | 41.0 | 54.0 | 62.0 | 67.0 | 70.0 | 72.0 | 74.0 |
| 450 | 0.0 | 0.0 | 0.0 | 2.0 | 8.0 | 21.0 | 36.0 | 48.0 | 57.0 | 63.0 | 67.0 | 70.0 | 71.0 |
| 500 | 0.0 | 0.0 | 0.0 | 1.0 | 6.0 | 17.0 | 32.0 | 45.0 | 55.0 | 61.5 | 64.0 | 69.0 | 71.0 |
| 600 | 0.0 | 0.0 | 0.0 | 1.0 | 5.0 | 15.0 | 28.0 | 42.0 | 52.0 | 60.0 | 64.0 | 68.0 | 70.0 |
| 700 | 0.0 | 0.0 | 0.0 | 1.0 | 3.0 | 13.0 | 28.0 | 44.0 | 57.0 | 66.0 | 72.0 | 75.0 | 78.0 |
| 800 | 0.0 | 0.0 | 0.0 | 0.0 | 1.0 | 7.0 | 17.0 | 30.0 | 41.0 | 50.0 | 57.0 | 61.0 | 64.0 |
| 900 | 0.0 | 0.0 | 0.0 | 0.0 | 1.0 | 5.0 | 14.0 | 26.0 | 38.0 | 47.0 | 54.0 | 59.0 | 63.0 |
| 1000 | 0.0 | 0.0 | 0.0 | 0.0 | 1.0 | 4.0 | 12.0 | 24.0 | 36.0 | 47.0 | 54.0 | 60.0 | 64.0 |
| H-8 | | | | | | | | | | | | | |

TABLE 6-continued

THERMAL AGING, PERCENT TRANSMISSION
HALS Formulations
Thermal Aging at 130 C.

PERCENT TRANSMISSION
Wavelength, nanometers

| Hours | 260 | 280 | 300 | 320 | 340 | 360 | 380 | 400 | 420 | 440 | 460 | 480 | 500 |
|---|---|---|---|---|---|---|---|---|---|---|---|---|---|
| 0 | 1.5 | 27.0 | 53.0 | 68.0 | 77.0 | 81.0 | 83.0 | 84.0 | — | — | — | — | — |
| 1 | 1.0 | 20.0 | 41.0 | 57.0 | 69.0 | 75.0 | 79.0 | 81.0 | 82.0 | 83.0 | 84.0 | 84.0 | 85.0 |
| 4 | 0.0 | 9.0 | 28.0 | 51.0 | 65.0 | 73.0 | 78.0 | 81.0 | 82.0 | 83.0 | 84.0 | 84.0 | 85.0 |
| 10 | 0.0 | 5.0 | 22.0 | 47.0 | 62.0 | 72.0 | 78.0 | 81.0 | 82.0 | 83.0 | 84.0 | 84.5 | 85.0 |
| 25 | 0.0 | 3.0 | 18.0 | 41.0 | 57.0 | 68.0 | 74.0 | 77.0 | 79.0 | 79.0 | 80.0 | 80.0 | 81.0 |
| 50 | 0.0 | 0.0 | 10.0 | 32.0 | 49.0 | 63.0 | 71.0 | 75.0 | 77.0 | 79.0 | 80.0 | 80.0 | 81.0 |
| 100 | 0.0 | 0.0 | 4.0 | 20.0 | 36.0 | 52.0 | 63.0 | 70.0 | 74.0 | 76.5 | 78.0 | 79.0 | 80.0 |
| 150 | 0.0 | 0.0 | 2.0 | 13.0 | 26.0 | 42.0 | 55.0 | 64.0 | 69.0 | 73.0 | 75.0 | 76.0 | 78.0 |
| 200 | 0.0 | 0.0 | 0.0 | 6.0 | 16.0 | 29.0 | 44.0 | 55.0 | 63.0 | 68.0 | 71.0 | 74.0 | 75.0 |
| 250 | 0.0 | 0.0 | 0.0 | 3.0 | 9.0 | 19.0 | 31.0 | 44.0 | 53.0 | 60.0 | 64.0 | 68.0 | 70.0 |
| 300 | 0.0 | 0.0 | 0.0 | 2.0 | 6.0 | 14.0 | 24.0 | 37.0 | 48.0 | 55.0 | 61.0 | 66.0 | 69.0 |
| 350 | 0.0 | 0.0 | 0.0 | 0.0 | 4.0 | 11.0 | 21.0 | 33.0 | 44.0 | 53.0 | 60.0 | 64.0 | 68.0 |
| 400 | 0.0 | 0.0 | 0.0 | 0.0 | 2.0 | 7.0 | 16.0 | 27.0 | 38.0 | 47.0 | 55.0 | 60.0 | 65.0 |
| 450 | 0.0 | 0.0 | 0.0 | 0.0 | 1.0 | 4.0 | 10.0 | 20.0 | 30.0 | 39.0 | 47.0 | 54.0 | 60.0 |
| 500 | 0.0 | 0.0 | 0.0 | 0.0 | 0.0 | 3.0 | 9.0 | 17.0 | 26.0 | 35.0 | 44.0 | 51.0 | 57.0 |
| 600 | 0.0 | 0.0 | 0.0 | 0.0 | 0.0 | 3.0 | 7.0 | 15.0 | 25.0 | 35.0 | 43.0 | 51.0 | 56.0 |
| 700 | 0.0 | 0.0 | 0.0 | 0.0 | 0.0 | 1.0 | 5.0 | 12.0 | 20.0 | 30.0 | 39.0 | 47.0 | 54.0 |
| 800 | 0.0 | 0.0 | 0.0 | 0.0 | 0.0 | 1.0 | 4.0 | 9.0 | 17.0 | 25.0 | 34.0 | 42.0 | 49.0 |
| 900 | 0.0 | 0.0 | 0.0 | 0.0 | 0.0 | 1.0 | 3.0 | 8.0 | 16.0 | 25.0 | 34.0 | 42.0 | 49.0 |
| 1000 | 0.0 | 0.0 | 0.0 | 0.0 | 0.0 | 1.0 | 2.0 | 5.0 | 15.0 | 24.0 | 33.0 | 42.0 | 49.0 |

TABLE 7

THERMAL AGING, PERCENTAGE OF ONE HOUR BASE VALUES
PERCENT CHANGE VS. ONE HOUR VALUES

Wavelength, nanometers

| Hours | 260 | 280 | 300 | 320 | 340 | 360 | 380 | 400 | 420 | 440 | 460 | 480 | 500 |
|---|---|---|---|---|---|---|---|---|---|---|---|---|---|
| H-1 | | | | | | | | | | | | | |
| 0 | — | — | — | — | — | — | — | — | — | — | — | — | — |
| 1 | 100.0% | 100.0% | 100.0% | 100.0% | 100.0% | 100.0% | 100.0% | 100.0% | 100.0% | 100.0% | 100.0% | 100.0% | 100.0% |
| 4 | 0.0% | 52.9% | 72.5% | 87.9% | 92.9% | 96.1% | 98.1% | 98.8% | 98.8% | 99.4% | 98.8% | 99.4% | 100.0% |
| 10 | 0.0% | 23.5% | 50.0% | 77.6% | 85.7% | 92.8% | 96.2% | 97.5% | 97.0% | 98.2% | 97.6% | 98.8% | 98.8% |
| 25 | 0.0% | 5.9% | 32.5% | 62.1% | 75.7% | 84.2% | 88.6% | 88.9% | 86.7% | 85.5% | 94.0% | 79.8% | 77.4% |
| 50 | 0.0% | 0.0% | 12.5% | 39.7% | 58.6% | 75.0% | 83.5% | 88.9% | 89.8% | 91.6% | 91.7% | 92.9% | 92.9% |
| 100 | 0.0% | 0.0% | 2.5% | 13.8% | 28.6% | 48.7% | 64.6% | 74.1% | 78.3% | 83.1% | 84.5% | 86.9% | 88.1% |
| 150 | 0.0% | 0.0% | 0.0% | 5.2% | 14.3% | 31.6% | 50.6% | 66.7% | 77.1% | 84.3% | 88.1% | 90.5% | 92.9% |
| 200 | 0.0% | 0.0% | 0.0% | 0.0% | 4.3% | 13.2% | 26.6% | 43.2% | 56.6% | 68.7% | 75.0% | 81.0% | 85.7% |
| 250 | 0.0% | 0.0% | 0.0% | 0.0% | 0.0% | 3.9% | 11.4% | 23.5% | 34.9% | 47.0% | 56.0% | 64.3% | 70.2% |
| 300 | 0.0% | 0.0% | 0.0% | 0.0% | 1.4% | 3.9% | 10.1% | 22.2% | 36.1% | 49.4% | 59.5% | 69.0% | 76.2% |
| 350 | 0.0% | 0.0% | 0.0% | 0.0% | 0.0% | 2.6% | 6.3% | 17.3% | 27.7% | 41.0% | 52.4% | 61.9% | 67.9% |
| 400 | 0.0% | 0.0% | 0.0% | 0.0% | 0.0% | 3.9% | 6.3% | 14.8% | 25.3% | 37.3% | 48.8% | 57.1% | 89.3% |
| 450 | 0.0% | 0.0% | 0.0% | 0.0% | 0.0% | 0.0% | 1.3% | 3.7% | 10.8% | 20.5% | 31.0% | 40.5% | 48.8% |
| 500 | 0.0% | 0.0% | 0.0% | 0.0% | 0.0% | 1.3% | 2.5% | 8.6% | 18.1% | 28.9% | 39.3% | 50.0% | 58.3% |
| 600 | 0.0% | 0.0% | 0.0% | 0.0% | 0.0% | 0.0% | 1.3% | 3.7% | 9.6% | 18.1% | 28.6% | 39.3% | 48.8% |
| 700 | 0.0% | 0.0% | 0.0% | 0.0% | 0.0% | 0.0% | 1.3% | 3.7% | 9.6% | 18.1% | 27.4% | 36.9% | 45.2% |
| 800 | 0.0% | 0.0% | 0.0% | 0.0% | 0.0% | 0.0% | 0.0% | 2.5% | 7.2% | 14.5% | 23.8% | 33.3% | 42.9% |
| 900 | 0.0% | 0.0% | 0.0% | 0.0% | 0.0% | 0.0% | 0.0% | 1.9% | 4.8% | 22.9% | 19.0% | 28.6% | 36.9% |
| 1000 | 0.0% | 0.0% | 0.0% | 0.0% | 0.0% | 0.0% | 0.0% | 1.2% | 3.6% | 7.8% | 13.1% | 17.9% | 22.6% |
| H-2 | | | | | | | | | | | | | |
| 0 | — | — | — | — | — | — | — | — | — | — | — | — | — |
| 1 | 100.0% | 100.0% | 100.0% | 100.0% | 100.0% | 100.0% | 100.0% | 100.0% | 100.0% | 100.0% | 100.0% | 100.0% | 100.0% |
| 4 | 0.0% | 47.1% | 73.0% | 87.3% | 92.3% | 95.8% | 97.3% | 98.7% | 98.7% | 98.7% | 99.4% | 98.7% | 100.0% |
| 10 | 0.0% | 23.5% | 54.1% | 78.2% | 87.7% | 93.0% | 95.9% | 97.4% | 98.7% | 98.7% | 98.7% | 98.7% | 100.0% |
| 25 | 0.0% | 11.8% | 40.5% | 67.3% | 80.0% | 88.0% | 91.9% | 94.7% | 94.8% | 93.6% | 95.5% | 94.9% | 96.2% |
| 50 | 0.0% | 0.0% | 24.3% | 52.7% | 70.8% | 84.5% | 90.5% | 94.1% | 96.1% | 96.2% | 96.8% | 97.5% | 97.5% |
| 100 | 0.0% | 0.0% | 8.1% | 30.9% | 50.8% | 69.0% | 81.1% | 86.8% | 90.3% | 92.3% | 93.0% | 93.7% | 94.5% |
| 150 | 0.0% | 0.0% | 4.1% | 20.0% | 38.5% | 56.3% | 70.9% | 80.3% | 84.4% | 87.2% | 89.2% | 88.6% | 88.6% |
| 200 | 0.0% | 0.0% | 0.0% | 12.7% | 26.2% | 47.9% | 66.2% | 80.3% | 88.3% | 93.6% | 95.5% | 97.5% | 98.7% |
| 250 | 0.0% | 0.0% | 0.0% | 5.5% | 12.3% | 26.8% | 43.2% | 57.9% | 70.1% | 76.9% | 81.5% | 84.8% | 87.3% |
| 300 | 0.0% | 0.0% | 0.0% | 2.7% | 7.7% | 19.7% | 35.1% | 51.3% | 63.6% | 73.1% | 79.6% | 83.5% | 87.3% |
| 350 | 0.0% | 0.0% | 0.0% | 1.8% | 4.6% | 12.7% | 25.7% | 42.1% | 55.8% | 66.7% | 75.2% | 81.0% | 84.8% |
| 400 | 0.0% | 0.0% | 0.0% | 0.0% | 3.1% | 8.5% | 18.9% | 34.2% | 49.4% | 60.3% | 70.1% | 77.2% | 82.3% |
| 450 | 0.0% | 0.0% | 0.0% | 0.0% | 1.5% | 7.0% | 16.2% | 28.9% | 44.2% | 55.1% | 65.0% | 72.2% | 78.5% |
| 500 | 0.0% | 0.0% | 0.0% | 0.0% | 1.5% | 5.6% | 13.5% | 26.3% | 40.3% | 53.8% | 58.6% | 72.2% | 78.5% |
| 600 | 0.0% | 0.0% | 0.0% | 0.0% | 0.0% | 2.8% | 8.1% | 18.4% | 31.2% | 43.6% | 54.8% | 64.6% | 72.2% |
| 700 | 0.0% | 0.0% | 0.0% | 0.0% | 0.0% | 0.0% | 3.4% | 10.5% | 23.4% | 39.7% | 54.8% | 67.1% | 75.9% |
| 800 | 0.0% | 0.0% | 0.0% | 0.0% | 0.0% | 0.0% | 4.1% | 11.8% | 22.1% | 33.3% | 45.9% | 55.7% | 64.6% |
| 900 | 0.0% | 0.0% | 0.0% | 0.0% | 0.0% | 0.0% | 2.7% | 9.2% | 19.5% | 30.8% | 42.0% | 51.9% | 62.0% |
| 1000 | 0.0% | 0.0% | 0.0% | 0.0% | 0.0% | 1.4% | 2.7% | 8.6% | 18.2% | 29.5% | 40.8% | 51.9% | 60.8% |
| H-3 | | | | | | | | | | | | | |
| 0 | — | — | — | — | — | — | — | — | — | — | — | — | — |
| 1 | 100.0% | 100.0% | 100.0% | 100.0% | 100.0% | 100.0% | 100.0% | 100.0% | 100.0% | 100.0% | 100.0% | 100.0% | 100.0% |
| 4 | 0.0% | 47.1% | 73.0% | 92.6% | 98.5% | 102.8% | 104.6% | 105.8% | 105.1% | 105.7% | 105.0% | 105.6% | 106.3% |

TABLE 7-continued

THERMAL AGING, PERCENTAGE OF ONE HOUR BASE VALUES
PERCENT CHANGE VS. ONE HOUR VALUES

| Hours | Wavelength, nanometers | | | | | | | | | | | | |
|---|---|---|---|---|---|---|---|---|---|---|---|---|---|
| | 260 | 280 | 300 | 320 | 340 | 360 | 380 | 400 | 420 | 440 | 460 | 480 | 500 |
| 10 | 0.0% | 20.6% | 54.1% | 79.6% | 90.9% | 98.6% | 101.3% | 102.6% | 102.5% | 103.1% | 102.5% | 103.1% | 103.8% |
| 25 | 0.0% | 8.8% | 32.4% | 63.0% | 75.8% | 86.8% | 91.4% | 92.9% | 91.1% | 94.3% | 94.4% | 95.0% | 95.0% |
| 50 | 0.0% | 0.0% | 16.2% | 46.3% | 65.2% | 80.6% | 88.7% | 92.9% | 94.9% | 95.6% | 96.3% | 98.8% | 98.8% |
| 100 | 0.0% | 0.0% | 8.1% | 31.5% | 51.5% | 72.2% | 84.8% | 91.6% | 93.7% | 96.2% | 97.5% | 98.8% | 98.8% |
| 150 | 0.0% | 0.0% | 5.4% | 22.2% | 42.4% | 63.9% | 79.5% | 87.7% | 91.1% | 93.1% | 95.0% | 96.3% | 97.5% |
| 200 | 0.0% | 0.0% | 0.0% | 13.0% | 28.8% | 51.4% | 67.5% | 78.1% | 83.5% | 86.8% | 89.4% | 91.3% | 92.5% |
| 250 | 0.0% | 0.0% | 0.0% | 9.3% | 22.7% | 41.7% | 59.6% | 72.3% | 79.7% | 84.3% | 88.8% | 90.0% | 92.5% |
| 300 | 0.0% | 0.0% | 0.0% | 7.4% | 18.2% | 37.5% | 57.0% | 71.0% | 81.0% | 86.8% | 90.0% | 92.5% | 95.0% |
| 350 | 0.0% | 0.0% | 0.0% | 3.7% | 13.6% | 30.6% | 49.0% | 64.5% | 74.7% | 81.8% | 86.9% | 90.0% | 92.5% |
| 400 | 0.0% | 0.0% | 0.0% | 0.0% | 9.1% | 23.6% | 41.1% | 56.8% | 67.1% | 75.5% | 81.3% | 85.0% | 87.5% |
| 450 | 0.0% | 0.0% | 0.0% | 1.9% | 9.1% | 22.2% | 39.7% | 58.1% | 70.3% | 80.5% | 86.3% | 90.0% | 93.8% |
| 500 | 0.0% | 0.0% | 0.0% | 1.9% | 6.1% | 18.1% | 34.4% | 51.6% | 64.6% | 75.5% | 82.5% | 86.9% | 90.0% |
| 600 | 0.0% | 0.0% | 0.0% | 0.0% | 3.0% | 12.5% | 26.5% | 42.6% | 57.0% | 67.9% | 76.3% | 81.3% | 86.3% |
| 700 | 0.0% | 0.0% | 0.0% | 0.0% | 1.5% | 9.7% | 22.5% | 38.7% | 54.4% | 65.4% | 75.0% | 81.3% | 85.0% |
| 800 | 0.0% | 0.0% | 0.0% | 0.0% | 1.5% | 6.9% | 17.2% | 32.3% | 45.6% | 59.1% | 67.5% | 75.0% | 81.3% |
| 900 | 0.0% | 0.0% | 0.0% | 0.0% | 1.5% | 4.2% | 13.2% | 27.1% | 40.5% | 52.8% | 63.8% | 65.0% | 77.5% |
| 1000 | 0.0% | 0.0% | 0.0% | 0.0% | 1.5% | 4.2% | 13.2% | 27.1% | 42.4% | 56.6% | 67.5% | 76.3% | 81.3% |
| H-4 | | | | | | | | | | | | | |
| 0 | — | — | — | — | — | — | — | — | — | — | — | — | — |
| 1 | 100.0% | 100.0% | 100.0% | 100.0% | 100.0% | 100.0% | 100.0% | 100.0% | 100.0% | 100.0% | 100.0% | 100.0% | 100.0% |
| 4 | 0.0% | 50.0% | 74.4% | 86.2% | 91.4% | 96.1% | 97.5% | 98.8% | 98.8% | 98.8% | 99.4% | 99.4% | 100.0% |
| 10 | 0.0% | 22.2% | 53.8% | 77.6% | 87.1% | 93.4% | 96.3% | 97.6% | 98.8% | 98.8% | 98.8% | 98.8% | 98.8% |
| 25 | 0.0% | 11.1% | 35.9% | 60.3% | 73.6% | 82.9% | 87.5% | 90.2% | 91.6% | 91.7% | 91.7% | 91.8% | 92.9% |
| 50 | 0.0% | 0.0% | 20.5% | 46.6% | 62.9% | 76.3% | 82.5% | 86.6% | 89.2% | 89.3% | 89.9% | 90.6% | 91.8% |
| 100 | 0.0% | 0.0% | 7.7% | 27.6% | 42.9% | 60.5% | 70.0% | 76.8% | 80.1% | 82.1% | 82.8% | 83.5% | 84.7% |
| 150 | 0.0% | 0.0% | 5.1% | 17.2% | 31.4% | 47.4% | 60.0% | 68.9% | 74.1% | 77.4% | 79.3% | 80.0% | 82.4% |
| 200 | 0.0% | 0.0% | 0.0% | 10.3% | 21.4% | 36.8% | 51.3% | 62.2% | 69.9% | 73.8% | 76.9% | 78.8% | 80.0% |
| 250 | 0.0% | 0.0% | 0.0% | 5.2% | 11.4% | 22.4% | 35.0% | 46.3% | 54.2% | 60.7% | 65.1% | 68.2% | 70.6% |
| 300 | 0.0% | 0.0% | 0.0% | 3.4% | 8.6% | 17.1% | 29.4% | 41.5% | 51.8% | 58.3% | 63.9% | 67.1% | 70.6% |
| 350 | 0.0% | 0.0% | 0.0% | 0.0% | 2.9% | 6.6% | 15.0% | 25.6% | 34.9% | 44.0% | 53.3% | 57.6% | 62.4% |
| 400 | 0.0% | 0.0% | 0.0% | 0.0% | 2.9% | 9.2% | 17.5% | 29.3% | 39.8% | 47.6% | 54.4% | 60.0% | 64.7% |
| 450 | 0.0% | 0.0% | 0.0% | 0.0% | 2.9% | 9.2% | 17.5% | 29.3% | 39.8% | 47.6% | 54.4% | 60.0% | 64.7% |
| 500 | 0.0% | 0.0% | 0.0% | 0.0% | 0.0% | 6.6% | 13.8% | 24.4% | 34.9% | 44.0% | 50.9% | 57.1% | 62.4% |
| 600 | 0.0% | 0.0% | 0.0% | 0.0% | 0.0% | 3.9% | 8.8% | 17.1% | 26.5% | 35.7% | 43.8% | 50.6% | 56.5% |
| 700 | 0.0% | 0.0% | 0.0% | 0.0% | 0.0% | 2.6% | 7.5% | 15.9% | 25.3% | 35.7% | 45.0% | 51.8% | 58.8% |
| 800 | 0.0% | 0.0% | 0.0% | 0.0% | 0.0% | 1.3% | 5.0% | 12.2% | 21.7% | 31.0% | 40.2% | 48.2% | 55.3% |
| 900 | 0.0% | 0.0% | 0.0% | 0.0% | 0.0% | 1.3% | 5.0% | 11.0% | 19.3% | 28.6% | 37.9% | 45.9% | 52.9% |
| 1000 | 0.0% | 0.0% | 0.0% | 0.0% | 0.0% | 1.3% | 3.8% | 9.8% | 18.1% | 27.4% | 37.3% | 45.9% | 52.9% |
| H-5 | | | | | | | | | | | | | |
| 0 | — | — | — | — | — | — | — | — | — | — | — | — | — |
| 1 | 100.0% | 100.0% | 100.0% | 100.0% | 100.0% | 100.0% | 100.0% | 100.0% | 100.0% | 100.0% | 100.0% | 100.0% | 100.0% |
| 4 | 0.0% | 35.7% | 63.6% | 81.6% | 90.0% | 93.9% | 95.7% | 97.3% | 98.0% | 97.4% | 97.4% | 98.1% | 97.4% |
| 10 | 0.0% | 21.4% | 51.5% | 77.6% | 90.0% | 97.0% | 85.7% | 101.4% | 102.0% | 101.3% | 101.3% | 101.9% | 101.3% |
| 25 | 0.0% | 7.1% | 30.3% | 55.1% | 70.0% | 81.8% | 87.1% | 90.4% | 91.3% | 92.1% | 92.2% | 93.5% | 93.6% |
| 50 | 0.0% | 0.0% | 9.1% | 32.7% | 50.0% | 65.2% | 75.7% | 80.8% | 84.6% | 86.8% | 88.3% | 89.0% | 89.7% |
| 100 | 0.0% | 0.0% | 3.0% | 16.3% | 30.0% | 47.0% | 60.0% | 68.5% | 75.2% | 78.9% | 81.8% | 85.2% | 85.9% |
| 150 | 0.0% | 0.0% | 0.0% | 8.2% | 18.3% | 30.3% | 42.9% | 52.1% | 60.4% | 65.8% | 70.1% | 73.5% | 75.6% |
| 200 | 0.0% | 0.0% | 0.0% | 0.0% | 10.0% | 21.2% | 34.3% | 46.6% | 57.7% | 64.5% | 70.1% | 73.5% | 76.9% |
| 250 | 0.0% | 0.0% | 0.0% | 0.0% | 5.0% | 10.6% | 20.0% | 31.5% | 40.3% | 48.7% | 54.5% | 60.6% | 65.4% |
| 300 | 0.0% | 0.0% | 0.0% | 0.0% | 3.3% | 10.6% | 21.4% | 32.9% | 44.3% | 53.9% | 62.3% | 68.4% | 73.1% |
| 350 | 0.0% | 0.0% | 0.0% | 0.0% | 0.0% | 4.5% | 11.4% | 20.5% | 30.9% | 39.5% | 48.1% | 56.8% | 61.5% |
| 400 | 0.0% | 0.0% | 0.0% | 0.0% | 0.0% | 3.0% | 8.6% | 16.4% | 25.5% | 35.5% | 44.2% | 51.6% | 57.7% |
| 450 | 0.0% | 0.0% | 0.0% | 0.0% | 0.0% | 4.5% | 11.4% | 20.5% | 32.2% | 43.4% | 51.9% | 59.4% | 65.4% |
| 500 | 0.0% | 0.0% | 0.0% | 0.0% | 0.0% | 1.5% | 5.7% | 11.0% | 20.1% | 28.9% | 37.7% | 46.5% | 52.6% |
| 600 | 0.0% | 0.0% | 0.0% | 0.0% | 0.0% | 1.5% | 4.3% | 9.6% | 16.1% | 25.0% | 32.5% | 41.3% | 47.4% |
| 700 | 0.0% | 0.0% | 0.0% | 0.0% | 0.0% | 1.5% | 4.3% | 11.0% | 19.5% | 30.3% | 40.3% | 50.3% | 57.7% |
| 800 | 0.0% | 0.0% | 0.0% | 0.0% | 0.0% | 0.0% | 2.9% | 6.8% | 25.5% | 19.7% | 27.3% | 36.1% | 43.6% |
| 900 | 0.0% | 0.0% | 0.0% | 0.0% | 0.0% | 0.0% | 1.4% | 5.5% | 9.4% | 17.1% | 26.0% | 34.8% | 42.3% |
| 1000 | 0.0% | 0.0% | 0.0% | 0.0% | 0.0% | 0.0% | 1.4% | 5.5% | 10.7% | 18.4% | 26.0% | 33.5% | 41.0% |
| H-6 | | | | | | | | | | | | | |
| 0 | — | — | — | — | — | — | — | — | — | — | — | — | — |
| 1 | 100.0% | 100.0% | 100.0% | 100.0% | 100.0% | 100.0% | 100.0% | 100.0% | 100.0% | 100.0% | 100.0% | 100.0% | 100.0% |
| 4 | 0.0% | 47.4% | 72.5% | 87.5% | 93.9% | 97.2% | 98.7% | 100.0% | 98.7% | 100.0% | 99.4% | 100.0% | 98.8% |
| 10 | 0.0% | 26.3% | 55.0% | 76.8% | 87.9% | 108.3% | 97.3% | 98.7% | 98.1% | 98.7% | 98.8% | 100.0% | 98.8% |
| 25 | 0.0% | 13.2% | 37.5% | 64.3% | 77.3% | 86.1% | 90.7% | 92.2% | 92.4% | 93.7% | 92.5% | 93.8% | 92.6% |
| 50 | 0.0% | 0.0% | 20.0% | 48.2% | 66.7% | 79.2% | 86.7% | 89.6% | 91.1% | 92.4% | 92.5% | 93.8% | 92.6% |
| 100 | 0.0% | 0.0% | 10.0% | 39.3% | 59.1% | 77.8% | 88.0% | 93.5% | 96.2% | 97.5% | 98.8% | 100.0% | 100.0% |
| 150 | 0.0% | 0.0% | 5.0% | 26.8% | 43.9% | 62.5% | 76.0% | 83.1% | 87.3% | 91.1% | 91.3% | 92.5% | 92.6% |
| 200 | 0.0% | 0.0% | 0.0% | 16.1% | 30.3% | 50.0% | 66.7% | 77.9% | 84.8% | 89.9% | 91.3% | 92.6% | 92.6% |
| 250 | 0.0% | 0.0% | 0.0% | 8.9% | 21.2% | 37.5% | 54.7% | 67.5% | 77.2% | 83.5% | 86.9% | 90.0% | 90.1% |
| 300 | 0.0% | 0.0% | 0.0% | 5.4% | 12.1% | 26.4% | 41.3% | 57.1% | 68.4% | 75.9% | 81.3% | 85.0% | 86.4% |
| 350 | 0.0% | 0.0% | 0.0% | 1.8% | 7.6% | 16.7% | 30.7% | 45.5% | 44.3% | 57.0% | 73.8% | 78.8% | 80.2% |
| 400 | 0.0% | 0.0% | 0.0% | 1.8% | 6.1% | 15.3% | 29.3% | 45.5% | 58.2% | 69.6% | 76.3% | 82.5% | 85.2% |
| 450 | 0.0% | 0.0% | 0.0% | 0.0% | 4.5% | 12.5% | 25.3% | 41.6% | 57.0% | 69.6% | 77.5% | 85.0% | 87.7% |
| 500 | 0.0% | 0.0% | 0.0% | 0.0% | 3.0% | 8.3% | 18.7% | 32.5% | 46.8% | 59.5% | 67.5% | 75.0% | 80.2% |
| 600 | 0.0% | 0.0% | 0.0% | 0.0% | 1.5% | 4.2% | 12.0% | 24.7% | 36.7% | 49.4% | 58.8% | 67.5% | 72.8% |
| 700 | 0.0% | 0.0% | 0.0% | 0.0% | 0.0% | 4.2% | 10.7% | 20.8% | 34.2% | 46.8% | 57.5% | 67.5% | 74.1% |

TABLE 7-continued

THERMAL AGING, PERCENTAGE OF ONE HOUR BASE VALUES
PERCENT CHANGE VS. ONE HOUR VALUES

| Hours | 260 | 280 | 300 | 320 | 340 | 360 | 380 | 400 | 420 | 440 | 460 | 480 | 500 |
|---|---|---|---|---|---|---|---|---|---|---|---|---|---|
| 800 | 0.0% | 0.0% | 0.0% | 0.0% | 0.0% | 2.8% | 8.0% | 18.2% | 31.6% | 44.3% | 56.3% | 66.3% | 72.8% |
| 900 | 0.0% | 0.0% | 0.0% | 0.0% | 0.0% | 1.4% | 5.3% | 13.0% | 22.8% | 34.2% | 45.0% | 55.0% | 61.7% |
| 1000 | 0.0% | 0.0% | 0.0% | 0.0% | 0.0% | 1.4% | 5.3% | 11.7% | 22.8% | 35.4% | 47.5% | 57.5% | 65.4% |
| H-7 | | | | | | | | | | | | | |
| 0 | — | — | — | — | — | — | — | — | — | — | — | — | — |
| 1 | 100.0% | 100.0% | 100.0% | 100.0% | 100.0% | 100.0% | 100.0% | 100.0% | 100.0% | 100.0% | 100.0% | 100.0% | 100.0% |
| 4 | 0.0% | 44.4% | 66.7% | 81.8% | 88.1% | 91.8% | 94.7% | 96.2% | 95.6% | 96.9% | 96.3% | 97.5% | 96.3% |
| 10 | 0.0% | 27.8% | 56.4% | 78.2% | 88.1% | 93.8% | 97.4% | 98.7% | 98.7% | 98.8% | 98.8% | 98.8% | 98.8% |
| 25 | 0.0% | 11.1% | 33.3% | 61.8% | 71.6% | 80.8% | 85.5% | 88.5% | 89.3% | 90.0% | 90.1% | 91.4% | 90.2% |
| 50 | 0.0% | 0.0% | 20.5% | 49.1% | 64.2% | 78.1% | 85.5% | 88.5% | 89.3% | 91.3% | 91.4% | 92.6% | 91.5% |
| 100 | 0.0% | 0.0% | 9.0% | 32.7% | 52.2% | 68.5% | 78.9% | 84.6% | 86.8% | 87.5% | 88.9% | 90.1% | 90.2% |
| 150 | 0.0% | 0.0% | 5.1% | 25.5% | 44.8% | 63.0% | 76.3% | 82.1% | 85.5% | 87.5% | 88.9% | 90.1% | 90.2% |
| 200 | 0.0% | 0.0% | 0.0% | 21.8% | 40.3% | 63.0% | 77.6% | 85.9% | 89.3% | 92.5% | 92.6% | 93.8% | 93.9% |
| 250 | 0.0% | 0.0% | 0.0% | 10.9% | 23.9% | 42.5% | 57.9% | 67.9% | 73.0% | 77.5% | 79.0% | 81.5% | 81.7% |
| 300 | 0.0% | 0.0% | 0.0% | 10.9% | 25.4% | 47.9% | 65.8% | 78.2% | 84.3% | 90.0% | 91.4% | 93.8% | 93.9% |
| 350 | 0.0% | 0.0% | 0.0% | 7.3% | 17.9% | 38.4% | 56.6% | 70.5% | 78.0% | 83.1% | 86.4% | 87.7% | 89.0% |
| 400 | 0.0% | 0.0% | 0.0% | 5.5% | 16.4% | 35.6% | 53.9% | 69.2% | 78.0% | 83.8% | 86.4% | 88.9% | 90.2% |
| 450 | 0.0% | 0.0% | 0.0% | 3.6% | 11.9% | 28.8% | 47.4% | 61.5% | 71.7% | 78.8% | 82.7% | 86.4% | 86.6% |
| 500 | 0.0% | 0.0% | 0.0% | 1.8% | 9.0% | 23.3% | 42.1% | 57.7% | 69.2% | 76.9% | 81.5% | 85.2% | 86.6% |
| 600 | 0.0% | 0.0% | 0.0% | 1.8% | 7.5% | 20.5% | 36.8% | 53.8% | 65.4% | 75.0% | 79.0% | 84.0% | 85.4% |
| 700 | 0.0% | 0.0% | 0.0% | 1.8% | 4.5% | 17.8% | 36.8% | 56.4% | 71.7% | 82.5% | 88.9% | 92.6% | 95.1% |
| 800 | 0.0% | 0.0% | 0.0% | 0.0% | 1.5% | 9.6% | 22.4% | 38.5% | 51.6% | 62.5% | 70.4% | 75.3% | 78.0% |
| 900 | 0.0% | 0.0% | 0.0% | 0.0% | 1.5% | 6.8% | 18.4% | 33.3% | 47.8% | 58.8% | 66.7% | 72.8% | 76.8% |
| 1000 | 0.0% | 0.0% | 0.0% | 0.0% | 1.5% | 5.5% | 15.8% | 30.8% | 45.3% | 58.8% | 66.7% | 74.1% | 78.0% |
| H-8 | | | | | | | | | | | | | |
| 0 | — | — | — | — | — | — | — | — | — | — | — | — | — |
| 1 | 100.0% | 100.0% | 100.0% | 100.0% | 100.0% | 100.0% | 100.0% | 100.0% | 100.0% | 100.0% | 100.0% | 100.0% | 100.0% |
| 4 | 0.0% | 45.0% | 68.3% | 89.5% | 94.2% | 97.3% | 98.7% | 100.0% | 100.0% | 100.0% | 100.0% | 100.0% | 100.0% |
| 10 | 0.0% | 25.0% | 53.7% | 83.5% | 89.9% | 96.0% | 98.7% | 100.0% | 100.0% | 100.0% | 100.0% | 100.0% | 100.0% |
| 25 | 0.0% | 15.0% | 43.9% | 71.9% | 82.6% | 90.7% | 93.7% | 95.1% | 96.3% | 95.2% | 95.2% | 95.2% | 95.3% |
| 50 | 0.0% | 0.0% | 24.4% | 56.1% | 71.0% | 84.0% | 89.9% | 92.6% | 93.9% | 95.2% | 95.2% | 95.2% | 95.3% |
| 100 | 0.0% | 0.0% | 9.8% | 35.1% | 52.2% | 69.3% | 79.7% | 86.4% | 90.2% | 92.2% | 92.9% | 94.0% | 94.1% |
| 150 | 0.0% | 0.0% | 4.9% | 22.8% | 37.7% | 56.0% | 69.6% | 79.0% | 84.1% | 88.0% | 89.3% | 90.5% | 91.8% |
| 200 | 0.0% | 0.0% | 0.0% | 10.5% | 23.2% | 38.7% | 55.7% | 67.9% | 76.8% | 81.9% | 84.5% | 88.1% | 88.2% |
| 250 | 0.0% | 0.0% | 0.0% | 5.3% | 13.0% | 25.3% | 39.2% | 54.3% | 64.6% | 72.3% | 76.2% | 81.0% | 82.4% |
| 300 | 0.0% | 0.0% | 0.0% | 3.5% | 8.7% | 18.7% | 30.4% | 45.7% | 58.5% | 66.3% | 72.6% | 78.6% | 81.2% |
| 350 | 0.0% | 0.0% | 0.0% | 0.0% | 5.8% | 14.7% | 26.6% | 40.7% | 53.7% | 63.9% | 71.4% | 76.2% | 80.0% |
| 400 | 0.0% | 0.0% | 0.0% | 0.0% | 2.9% | 9.3% | 20.3% | 33.3% | 46.3% | 56.6% | 65.5% | 71.4% | 76.5% |
| 450 | 0.0% | 0.0% | 0.0% | 0.0% | 1.4% | 5.3% | 12.7% | 24.7% | 36.6% | 47.0% | 56.0% | 64.3% | 70.6% |
| 500 | 0.0% | 0.0% | 0.0% | 0.0% | 0.0% | 4.0% | 11.4% | 21.0% | 31.7% | 42.2% | 52.4% | 60.7% | 67.1% |
| 600 | 0.0% | 0.0% | 0.0% | 0.0% | 0.0% | 4.0% | 8.9% | 18.5% | 30.5% | 42.2% | 51.2% | 60.7% | 65.9% |
| 700 | 0.0% | 0.0% | 0.0% | 0.0% | 0.0% | 1.3% | 6.3% | 14.8% | 24.4% | 36.1% | 46.4% | 56.0% | 63.5% |
| 800 | 0.0% | 0.0% | 0.0% | 0.0% | 0.0% | 1.3% | 5.1% | 11.1% | 20.7% | 30.1% | 40.5% | 50.0% | 57.6% |
| 900 | 0.0% | 0.0% | 0.0% | 0.0% | 0.0% | 1.3% | 3.8% | 9.9% | 19.5% | 30.1% | 40.5% | 50.0% | 57.6% |
| 1000 | 0.0% | 0.0% | 0.0% | 0.0% | 0.0% | 1.3% | 2.5% | 6.2% | 18.3% | 28.9% | 39.3% | 50.0% | 57.6% |

At very low wavelengths all formulations appear to "age" or show chemical change at exactly the same rate. At 280 nm all formulations go to 0% transmission within 50 hours, and significant changes can be seen after the first hour. Thus, EVA may suffer some chemical damage from the lamination process itself. At a wavelength of 300 nm, the individual formulations start to show slight differences as the thermal aging proceeds, and the differences become more apparent as the wavelength increases.

Figure 2:
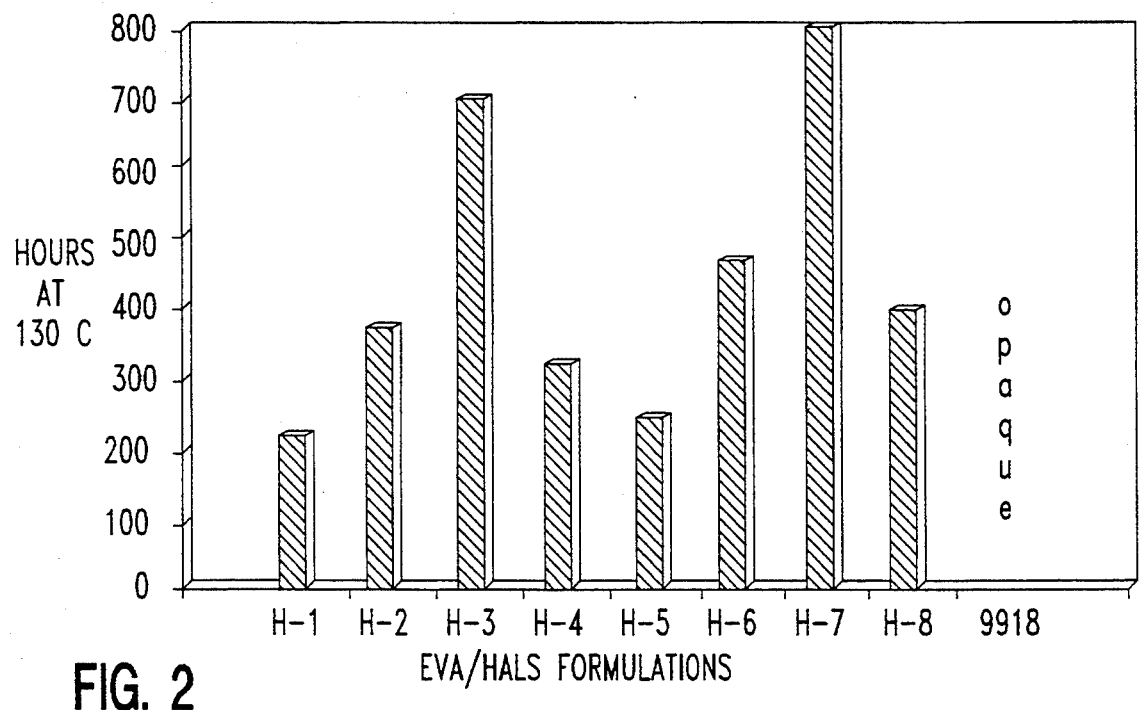
Figure 3:
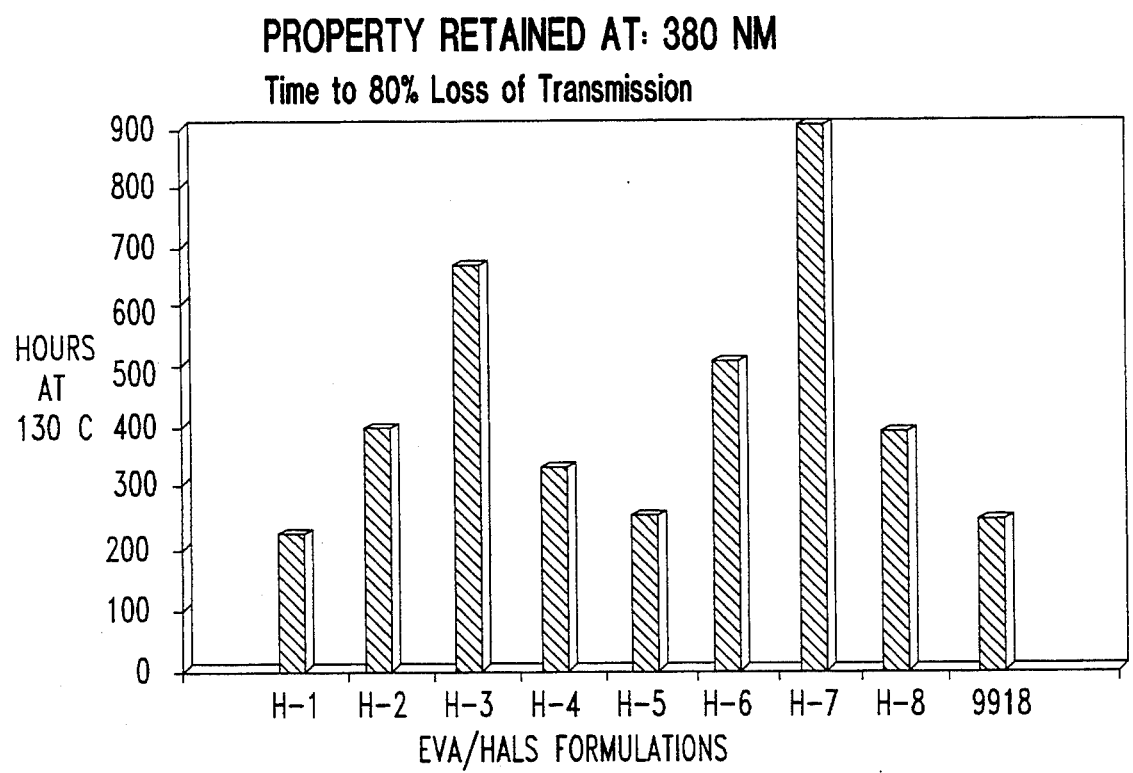
Figure 4:
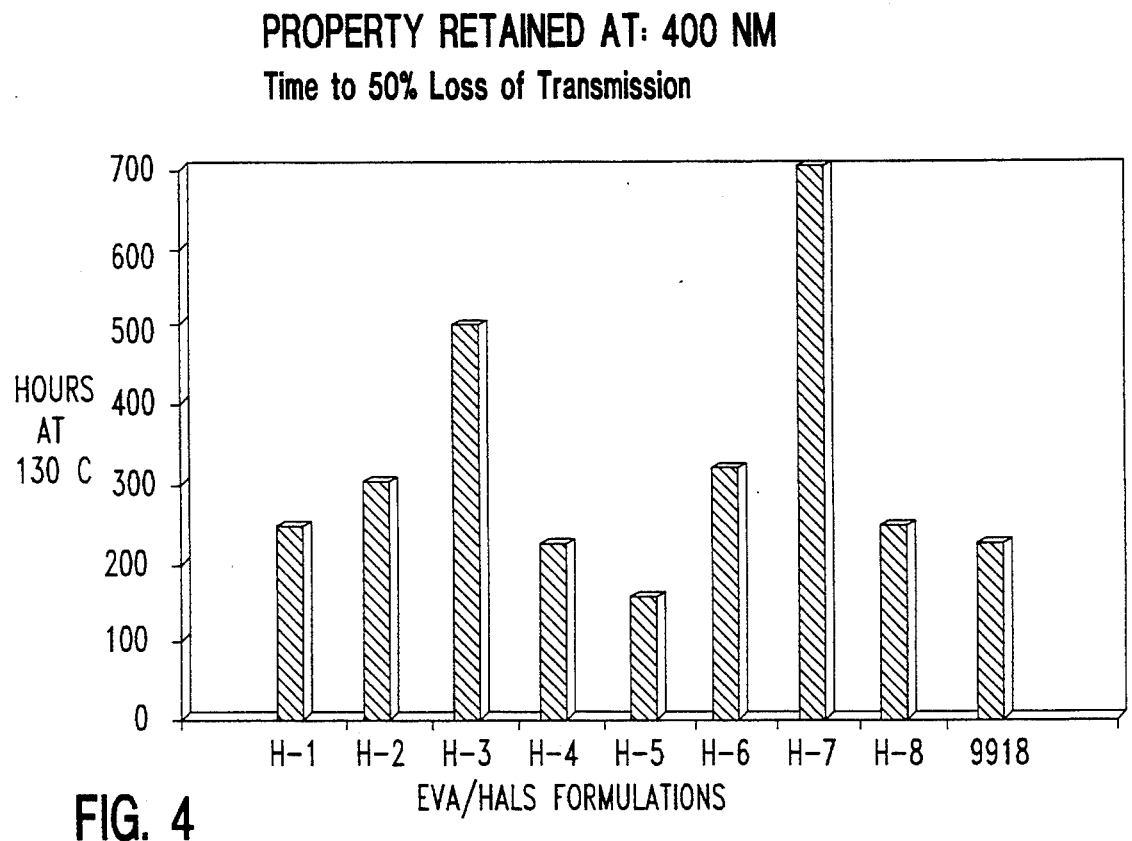

The observation is also made that the changes in transmission progress gradually with time, and that no "induction period" behavior, in which a sudden change occurs, is noticed. The effectiveness of stabilization is, then, just the rate of change. This can be seen subjectively by just scanning the numbers in Tables 6 and 7; however, the Property Retention Graphs, FIGS. 1 through 6, make this comparison a great deal easier. FIGS. 1 through 6 plot the time it takes for the optical transmission to degrade to a particular value at a specified wavelength.

The wavelengths of greatest commercial importance start around 400 nm. This is the beginning of visible effects, and also the wavelength at which the solar cells start to contribute some useful power. With higher wavelengths, the retention of full optical transparency for the Photovoltaic (PV) cells becomes increasingly important to provide maximum power output.

As can easily be seen, the "TINUVIN-770" formulation (H-i) is not nearly as effective as the two most effective HALS formulations, the "TINUVIN-622LD" formulation (H-3) and the "LUPERSOL HA-505" formulation (H-7). Comparison of optical transmissions at all wavelengths and all aging times clearly shows the superiority of these two compounds. At the lower wavelengths the H-7 formulation appears to be somewhat better than the H-3 formulation; however, the two seem to offer equal effectiveness in the higher ranges (>400 nm). In all, H-7 is the best performer.

The excellent performance of the H-7 formulation is particularly interesting because all the HALS compounds were added at the same concentration (0.1 phr); however, in this experiment the "LUPERSOL HA-505" formulation actually comprised 50% solvent, which was an inert carrier sold under the trademark "AROMATIC 100" discussed previously.

After 1,000 hours at 130° C., all test specimens except for the H-3 and H-7 formulations were withdrawn from testing. Interestingly, none showed any real flow or surface "tack" that indicates severe scission of the EVA backbone and consequent depolymerization. This is definitely noticed in all formulations which did not include an HALS compound.

Although the "LUPERSOL HA-505" HALS provides outstanding stabilization in cured EVA, it may present a difficulty with the long-term stability of an uncured sheet. This compound is based on a heat sensitive peroxycarbonate and the manufacturer recommends a storage temperature of 0° C. This might impose low temperature storage requirements for a fully compounded EVA sheet. On the other hand, the "TINU-VIN-622LD" HALS is a white powder that is stable at room temperatures and, as with most other HALS compounds, has no special storage conditions.

Spectra were compared to two controls, one designated H-C, which is plain peroxide cured "ELVAX-150" EVA (Table 8), and the other standard EVA A-9918 (Table 9).

As can be seen, the cured but unstabilized "ELVAX-150" EVA discolors and depolymerizes rapidly. After only 50 hours the test specimens had to be removed due to complete flow degradation. It is difficult to compare this to compounds containing stabilizers.

TABLE 8

COMPARISON WITH PEROXIDE CURED ELVAX-150

HALS Formulations
Thermal aging at 130 C.

| | Hours | Wavelength, nanometers | | | | | | | | | | | | |
|---|---|---|---|---|---|---|---|---|---|---|---|---|---|---|
| | | 260 | 280 | 300 | 320 | 340 | 360 | 380 | 400 | 420 | 440 | 460 | 480 | 500 |
| | | PERCENT TRANSMISSION | | | | | | | | | | | | |
| H-C | 0 | — | — | — | — | — | — | — | — | — | — | — | — | — |
| Control | 1 | 0.5 | 10.0 | 25.0 | 41.0 | 56.0 | 65.0 | 70.0 | 73.5 | 75.5 | 77.0 | 78.0 | 78.5 | 79.0 |
| | 4 | 0.0 | 1.0 | 10.0 | 28.0 | 44.0 | 57.0 | 65.0 | 70.0 | 73.0 | 75.0 | 76.0 | 77.5 | 78.0 |
| | 10 | 0.0 | 0.0 | 4.0 | 20.0 | 36.0 | 48.0 | 53.0 | 56.0 | 57.0 | 58.0 | 58.0 | 58.0 | 58.0 |
| | 25 | 0.0 | 0.0 | 0.0 | 3.0 | 12.0 | 25.0 | 40.0 | 53.0 | 62.5 | 70.0 | 74.0 | 78.0 | 79.0 |
| | 50 | 0.0 | — | — | — | — | — | — | — | — | — | — | — | — |
| | | PERCENT CHANGE VS. ONE HOUR VALUES | | | | | | | | | | | | |
| H-C | 0 | — | — | — | — | — | — | — | — | — | — | — | — | — |
| Control | 1 | 100.0% | 100.0% | 100.0% | 100.0% | 100.0% | 100.0% | 100.0% | 100.0% | 100.0% | 100.0% | 100.0% | 100.0% | 100.0% |
| | 4 | 0.0% | 10.0% | 40.0% | 68.3% | 78.6% | 87.7% | 92.9% | 95.2% | 96.7% | 97.4% | 97.4% | 98.7% | 98.7% |
| | 10 | 0.0% | 0.0% | 16.0% | 48.8% | 64.3% | 73.8% | 75.7% | 76.2% | 75.5% | 75.3% | 74.4% | 73.9% | 73.4% |
| | 25 | 0.0% | 0.0% | 0.0% | 7.3% | 21.4% | 38.5% | 57.1% | 72.1% | 82.8% | 90.9% | 94.9% | 99.4% | 100.0% |
| | 50 | 0.0% | 0.0% | 0.0% | 0.0% | 0.0% | 0.0% | 0.0% | 0.0% | 0.0% | 0.0% | 0.0% | 0.0 | 0.0% |

Discontinued due to complete depolymerization
Strong fluoresence

TABLE 9

COMPARISON WITH EVA A-9918

| | | PERCENT TRANSMISSION | | | | | | | PERCENT CHANGE | | | | |
|---|---|---|---|---|---|---|---|---|---|---|---|---|---|
| | Hours | 380 | 400 | 420 | 440 | 500 | | Hours | 380 | 400 | 420 | 440 | 500 |
| HALS/EVA A9918 Comparison Thermal aging at 130 C. | | | | | | | | | | | | | |
| H-1 | 0 | 75.0 | 76.0 | — | — | — | H-1 | 0 | — | — | — | — | — |
| | 1 | 79.0 | 81.0 | 83.0 | 83.0 | 84.0 | | 1 | 100.0% | 100.0% | 100.0% | 100.0% | 100.0% |
| | 4 | 77.5 | 80.0 | 82.0 | 82.5 | 84.0 | | 4 | 98.1% | 98.8% | 98.8% | 99.4% | 100.0% |
| | 10 | 76.0 | 79.0 | 80.5 | 81.5 | 83.0 | | 10 | 96.2% | 97.5% | 97.0% | 98.2% | 98.8% |
| | 25 | 70.0 | 72.0 | 72.0 | 71.0 | 65.0 | | 25 | 88.6% | 88.9% | 86.7% | 85.5% | 77.4% |
| | 50 | 66.0 | 72.0 | 74.5 | 76.0 | 78.0 | | 50 | 83.5% | 88.9% | 89.8% | 91.6% | 92.9% |
| | 100 | 51.0 | 60.0 | 65.0 | 69.0 | 74.0 | | 100 | 64.6% | 74.1% | 78.3% | 83.1% | 88.1% |
| | 150 | 40.0 | 54.0 | 64.0 | 70.0 | 78.0 | | 150 | 50.6% | 66.7% | 77.1% | 84.3% | 92.9% |
| | 200 | 21.0 | 35.0 | 47.0 | 57.0 | 72.0 | | 200 | 26.6% | 43.2% | 56.6% | 68.7% | 85.7% |
| | 250 | 9.0 | 19.0 | 29.0 | 39.0 | 59.0 | | 250 | 11.4% | 23.5% | 34.9% | 47.0% | 70.2% |
| | 300 | 8.0 | 18.0 | 30.0 | 41.0 | 64.0 | | 300 | 10.1% | 22.2% | 36.1% | 49.4% | 76.2% |
| | 350 | 5.0 | 14.0 | 23.0 | 34.0 | 57.0 | | 350 | 6.3% | 17.3% | 27.7% | 41.0% | 67.9% |
| | 400 | 5.0 | 12.0 | 21.0 | 31.0 | 75.0 | | 400 | 6.3% | 14.8% | 25.3% | 37.3% | 89.3% |
| | 450 | 1.0 | 3.0 | 9.0 | 17.0 | 41.0 | | 450 | 1.3% | 3.7% | 10.8% | 20.5% | 48.8% |
| | 500 | 2.0 | 7.0 | 15.0 | 24.0 | 49.0 | | 500 | 2.5% | 8.6% | 18.1% | 28.9% | 58.3% |
| | 600 | 1.0 | 3.0 | 8.0 | 15.0 | 41.0 | | 600 | 1.3% | 3.7% | 9.6% | 18.1% | 48.8% |
| | 700 | 1.0 | 3.0 | 8.0 | 15.0 | 38.0 | | 700 | 1.3% | 3.7% | 9.6% | 18.1% | 45.2% |
| | 800 | 0.0 | 2.0 | 6.0 | 12.0 | 36.0 | | 800 | 0.0% | 2.5% | 7.2% | 14.5% | 42.9% |
| | 900 | 0.0 | 1.5 | 4.0 | 19.0 | 31.0 | | 900 | 0.0% | 1.9% | 4.8% | 22.9% | 36.9% |
| | 1000 | 0.0 | 1.0 | 3.0 | 6.5 | 19.0 | | 1000 | 0.0% | 1.2% | 3.6% | 7.8% | 22.6% |
| Unbonded EVA in Air EVA Aging Experiments | | | | | | | | | | | | | |
| EVA 9918 | 0 | 30.0 | 70.0 | 77.0 | 78.0 | 80.0 | EVA 9918 | 0 | 100.0% | 100.0% | 100.0% | 100.0% | 100.0% |
| | 1 | 27.0 | 66.0 | 74.0 | 76.0 | 78.0 | Percent | 1 | 90.0% | 94.3% | 96.1% | 97.4% | 97.5% |
| | 5 | 26.0 | 66.0 | 75.0 | 77.0 | 78.0 | Change | 5 | 86.7% | 94.3% | 97.4% | 98.7% | 97.5% |
| | 10 | 22.0 | 60.0 | 69.0 | 72.0 | 75.0 | | 10 | 73.3% | 85.7% | 89.6% | 92.3% | 93.8% |
| | 30 | 22.0 | 60.0 | 69.0 | 72.0 | 75.0 | | 30 | 73.3% | 85.7% | 89.6% | 92.3% | 93.8% |
| | 50 | 20.0 | 54.0 | 63.0 | 66.0 | 70.0 | | 50 | 66.7% | 77.1% | 81.8% | 84.6% | 87.5% |
| | 70 | 25.0 | 47.0 | 56.0 | 60.0 | 66.0 | | 70 | 83.3% | 67.1% | 72.7% | 76.9% | 82.5% |
| | 90 | 16.0 | 48.0 | 58.0 | 63.0 | 68.0 | | 90 | 53.3% | 68.6% | 75.3% | 80.8% | 85.0% |
| | 120 | 16.0 | 47.0 | 59.0 | 63.0 | 70.0 | | 120 | 53.3% | 67.1% | 76.6% | 80.8% | 87.5% |
| | 150 | 13.0 | 42.0 | 54.0 | 60.0 | 67.0 | | 150 | 43.3% | 60.0% | 70.1% | 76.9% | 83.8% |
| | 200 | 11.0 | 39.0 | 53.0 | 60.0 | 61.0 | | 200 | 36.7% | 55.7% | 68.8% | 76.9% | 76.3% |

TABLE 9-continued

| | COMPARISON WITH EVA A-9918 | | | | | | | | | | |
|---|---|---|---|---|---|---|---|---|---|---|---|
| | PERCENT TRANSMISSION | | | | | | PERCENT CHANGE | | | | |
| Hours | 380 | 400 | 420 | 440 | 500 | Hours | 380 | 400 | 420 | 440 | 500 |
| 250 | 7.0 | 27.0 | 41.0 | 50.0 | 64.0 | 250 | 23.3% | 38.6% | 53.2% | 64.1% | 80.0% |

EXAMPLE 2

Preferably, encapsulants should also include an ultraviolet stabilizer to protect against discoloration due to ultraviolet degradation. In order to determine whether the addition of an ultraviolet stabilizer hinders the HALS compounds' ability to minimize thermal discoloration, an ultraviolet stabilizer sold under the trademark "CYASORB UV-531" by American Cyanamid, was added.

Table 9 compares the thermal aging of "A-9918" measured in previous experiments and H-1, both containing 0.1% of the "TINUVIN-770" HALS. Only minor variations were noticed, indicating that the presence of the "CYASORB UV-531" ultraviolet screener, which has a chemical name of 4-Octyl-2-hydroxybenzophenone, has little effect on overall stability in a thermal aging environment. Slight yellow discoloration becomes apparent in both after about 50 hours, and is easily noticeable at the 250 hour point. No major differences are apparent.

EXAMPLE 3

When excited by a simple hand-held "black light" (long wave, 366 nm) all thermally aged EVA formulations show a pale blue/green fluorescence. An additional sign of thermal degradation in EVA polymers can be noticed by this fluorescent emission. Fluorescence may serve as an early indicator of degradation. It clearly precedes the appearance of thermal discoloration and probably results from excitation of conjugated double bond structures.

All the EVA formulations on test were examined for fluorescence with a 366 nm ultraviolet light and the visible appearance of color throughout the exposure. "EVA A-9918" does not fluoresce due to the screening additive that blocks the exciting wavelengths. The results are recorded in Table 10.

The initial HALS formulations show no fluorescence after curing for 15 minutes at 150° C. After one hour at 130° C., very slight fluorescence is seen in all specimens and the florescence is a bit more noticeable in the plain cross-linked "ELVAX-150" EVA. In this specimen, faint "swirls" of fluorescence are observed, suggesting that temperature gradients from the flow during molding may have occurred. After 50 hours, the cross-linked "ELVAX-150" EVA showed a strong blue/green fluorescence and was removed from further testing due to complete depolymerization.

TABLE 10

| | COLOR AND FLUORESCENCE | | | | | | | |
|---|---|---|---|---|---|---|---|---|
| Hrs. | H-1 | H-2 | H-3 | H-4 | H-5 | H-6 | H-7 | H-8 |
| 10 | F = 2 | F = 2 | F = 2 | F = 2 | F = 2+ | F = 2 | F = 2 | F = 2 |
| | C = 2 | C = 2 | C = 0 | C = 2 | C = 2 | C = 2 | C = 0 | C = 2 |
| | S = 0 | S = 0 | S = 0 | S = 0 | S = 0 | S = 0 | S = 0 | S = 0 |
| 100 | F = 3 | F = 3 | F = 3 | F = 3 | F = 3 | F = 3 | F = 2+ | F = 3 |
| | C = 3 | C = 2 | C = 0 | C = 3 | C = 2 | C = 2 | C = 0 | C = 2 |
| | S = 0 | S = 0 | S = 0 | S = 3 | S = 3 | S = 0 | S = 0 | S = 3 |
| 200 | F = 3+ | F = 3 | F = 3 | F = 3 | F = 3 | F = 3 | F = 2+ | F = 3 |
| | C = 4 | C = 3 | C = 1 | C = 4 | C = 3 | C = 3 | C = 0 | C = 3 |
| | S = 0 | S = 0 | S = 0 | S = 4 | S = 4 | S = 0 | S = 0 | S = 4 |
| 250 | F = 3+ | F = 3 | F = 3 | F = 3 | F = 3 | F = 3 | F = 2+ | F = 3 |
| | C = 4 | C = 3 | C = 2 | C = 4 | C = 3 | C = 3 | C = 1 | C = 3 |
| | S = 0 | S = 0 | S = 0 | S = 4 | S = 4 | S = 0 | S = 0 | S = 4 |
| 400 | F = 3+ | F = 3 | F = 3 | F = 3 | F = 3 | F = 3 | F = 3 | F = 3 |
| | C = 5 | C = 4 | C = 2 | C = 4 | C = 3 | C = 3 | C = 1 | C = 3 |
| | S = 0 | S = 0 | S = 0 | S = 4 | S = 4 | S = 0 | S = 0 | S = 4 |
| 500 | F = 3+ | F = 3 | F = 3 | F = 3 | F = 3 | F = 3 | F = 3 | F = 3 |
| | C = 5 | C = 4 | C = 2+ | C = 4 | C = 4 | C = 3 | C = 2 | C = 4 |
| | S = 0 | S = 0 | S = 0 | S = 4 | S = 4 | S = 0 | S = 0 | S = 4 |
| 700 | F = 4 | F = 3 | F = 3 | F = 3 | F = 3 | F = 3 | F = 3 | F = 3 |
| | C = 5 | C = 4 | C = 2+ | C = 4 | C = 4 | C = 4 | C = 2+ | C = 4 |
| | S = 0 | S = 0 | S = 0 | S = 5 | S = 5 | S = 0 | S = 0 | S = 5 |
| 1000 | F = 4 | F = 4 | F = 4 | F = 4 | F = 4 | F = 4 | F = 4 | F = 4 |
| | C = 5 | C = 4 | C = 3 | C = 4 | C = 4 | C = 4 | C = 2+ | C = 4 |
| | S = 0 | S = 0 | S = 0 | S = 5 | S = 5 | S = 0 | S = 0 | S = 5 |

C = coloration (yellowness)
S = speckled appearance
F = fluorescence
1 = very slight
2 = slight
3 = noticeable
4 = strong
5 = very strong As the thermal aging proceeded, all formulations became noticeably fluorescent regardless of the type of stabilizer or appearance of discoloration. A subjective ranking was also used to record the discoloration (also Table 10). The "TINUVIN 770" formulation appeared to be the worst in this respect. Another very noticeable feature was "speckling" in which tiny brown spots appeared in formulations H-4, H-5 and H-8. This might be due to chemical insolubility, especially when a few of these additives are of high molecular weight, and therefore less miscible.

Fluorescence seems to be a part of the EVA chemistry that is not necessarily part of oxygen induced degradation. Specimens from previous work that were laminated between glass slides and maintained in an inert argon atmosphere show bright fluorescence, even though no discoloration has occurred. Also, photobleached specimens of the previous experiments with thermally aged specimens still show very strong fluorescence, despite their almost colorless appearance. This suggests that photo-oxidation may break up long conjugated sequences, but leaves other types of fluorophores. The predominantly "white" emission also indicates that a variety of chemical species may be contributory.

occasionally. This is probably where the rate of oxygen induced discoloration has overtaken the rate of oxygen assisted photobleaching.

Thermally discolored test samples (H-1 and H-2, 1000 hours/130° C.) were placed outdoors for a total of 250 hours. The H-2 specimen was additionally cut into two pieces; one was placed in a Petri dish and exposed to air, and the other was sealed in an ampoule of argon. This was done to further examine the role of oxygen in photobleaching. Spectroscopic measurements were made and the results were tabulated-as previously (Tables 11 and 12).

TABLE 11

PHOTOCHEMICAL BLEACHING, PERCENT TRANSMISSION
HALS Formulations
OUTDOOR PHOTOBLEACHING REACTIONS
PERCENT TRANSMISSION

| | Hrs/130 C. Hours | 260 | 280 | 300 | 320 | 340 | 360 | 380 | 400 | 420 | 440 | 460 | 480 | 500 |
|---|---|---|---|---|---|---|---|---|---|---|---|---|---|---|
| | | | | | | Wavelength, nanometers | | | | | | | | |
| H-1 | 0 | 1.0 | 21.0 | 44.0 | 59.0 | 68.0 | 73.0 | 75.0 | 76.0 | — | — | — | — | — |
| Air | 1 | 1.0 | 17.0 | 40.0 | 58.0 | 70.0 | 76.0 | 79.0 | 81.0 | 83.0 | 83.0 | 84.0 | 84.0 | 84.0 |
| | 1000 | 0.0 | 0.0 | 0.0 | 0.0 | 0.0 | 0.0 | 0.0 | 1.0 | 3.0 | 6.5 | 11.0 | 15.0 | 19.0 |
| | | | | | | Photobleaching, outdoors, in Air | | | | | | | | |
| | 250 | 0.0 | 0.0 | 0.0 | 0.0 | 0.0 | 2.0 | 6.0 | 13.0 | 23.0 | 33.0 | 43.0 | 46.0 | 58.0 |
| | | 260 | 280 | 300 | 320 | 340 | 360 | 380 | 400 | 420 | 440 | 460 | 480 | 500 |
| | | | | | | Wavelength, nanometers | | | | | | | | |
| H-2 | 0 | 1.5 | 23.0 | 44.0 | 58.5 | 67.0 | 71.0 | 73.0 | 75.0 | — | — | — | — | — |
| Air | 1 | 1.0 | 17.0 | 37.0 | 55.0 | 65.0 | 71.0 | 74.0 | 76.0 | 77.0 | 78.0 | 78.5 | 79.0 | 79.0 |
| | 1000 | 0.0 | 0.0 | 0.0 | 0.0 | 0.0 | 1.0 | 2.0 | 6.5 | 14.0 | 23.0 | 32.0 | 41.0 | 48.0 |
| | | | | | | Photobleaching, outdoors, in Air | | | | | | | | |
| | 250 | 0.0 | 0.0 | 0.0 | 1.0 | 3.0 | 9.0 | 18.0 | 28.0 | 38.0 | 47.0 | 54.0 | 59.0 | 63.0 |
| | | | | | | Wavelength, nanometers | | | | | | | | |
| H-2 | 0 | 1.5 | 23.0 | 44.0 | 58.5 | 67.0 | 71.0 | 73.0 | 75.0 | — | — | — | — | — |
| Argon | 1 | 1.0 | 17.0 | 37.0 | 55.0 | 65.0 | 71.0 | 74.0 | 76.0 | 77.0 | 78.0 | 78.5 | 79.0 | 79.0 |
| | 1000 | 0.0 | 0.0 | 0.0 | 0.0 | 0.0 | 1.0 | 2.0 | 6.5 | 14.0 | 23.0 | 32.0 | 41.0 | 48.0 |
| | | | | | | Photobleaching, outdoors, in Argon | | | | | | | | |
| | 250 | 0.0 | 0.0 | 0.0 | 0.0 | 1.0 | 2.0 | 7.0 | 13.0 | 22.0 | 30.0 | 38.0 | 45.0 | 51.0 |

TABLE 12

PHOTOCHEMICAL BLEACHING, PERCENT CHANGE
OUTDOOR PHOTOBLEACHING REACTIONS
PERCENT CHANGE VS. ONE HOUR VALUES

| | Hours | 260 | 280 | 300 | 320 | 340 | 360 | 380 | 400 | 420 | 440 | 460 | 480 | 500 |
|---|---|---|---|---|---|---|---|---|---|---|---|---|---|---|
| | | | | | | Wavelength, nanometers | | | | | | | | |
| H-1 | 0 | — | — | — | — | — | — | — | — | — | — | — | — | — |
| Air | 1 | 100.0% | 100.0% | 100.0% | 100.0% | 100.0% | 100.0% | 100.0% | 100.0% | 100.0% | 100.0% | 100.0% | 100.0% | 100.0% |
| | 1000 | 0.0% | 0.0% | 0.0% | 0.0% | 0.0% | 0.0% | 0.0% | 1.2% | 3.6% | 7.8% | 13.1% | 17.9% | 22.6% |
| | | | | | | Photobleaching, outdoors, in Air | | | | | | | | |
| | 250 | 0.0% | 0.0% | 0.0% | 0.0% | 0.0% | 2.6% | 7.6% | 16.0% | 27.7% | 39.8% | 51.2% | 54.8% | 69.0% |
| | | | | | | Wavelength, nanometers | | | | | | | | |
| H-2 | 0 | — | — | — | — | — | — | — | — | — | — | — | — | — |
| Air | 1 | 100.0% | 100.0% | 100.0% | 100.0% | 100.0% | 100.0% | 100.0% | 100.0% | 100.0% | 100.0% | 100.0% | 100.0% | 100.0% |
| | 1000 | 0.0% | 0.0% | 0.0% | 0.0% | 0.0% | 1.4% | 2.7% | 8.6% | 18.2% | 29.5% | 40.8% | 51.9% | 60.8% |
| | | | | | | Photobleaching, outdoors, in Air | | | | | | | | |
| | 250 | 0.0% | 0.0% | 0.0% | 1.8% | 4.6% | 12.7% | 24.3% | 36.8% | 49.4% | 60.3% | 68.8% | 74.7% | 79.7% |
| | | | | | | Wavelength, nanometers | | | | | | | | |
| H-2 | 0 | — | — | — | — | — | — | — | — | — | — | — | — | — |
| Argon | 1 | 100.0% | 100.0% | 100.0% | 100.0% | 100.0% | 100.0% | 100.0% | 100.0% | 100.0% | 100.0% | 100.0% | 100.0% | 100.0% |
| | 1000 | 0.0% | 0.0% | 0.0% | 0.0% | 0.0% | 1.4% | 2.7% | 8.6% | 18.2% | 29.5% | 40.8% | 51.9% | 60.8% |
| | | | | | | Photobleaching, outdoors, in Argon | | | | | | | | |
| | 250 | 0.0% | 0.0% | 0.0% | 0.0% | 1.5% | 2.8% | 9.5% | 17.1% | 28.6% | 38.5% | 48.4% | 57.0% | 64.6% |

EXAMPLE 4

Photochemical bleaching (photo-oxidation) is known to occur in modules deployed outdoors. This is the most likely reason for the appearance of dark areas over the cells (oxygen deficient) and clarity at the edges (where oxygen has diffused in). The reverse effect is also seen Comparing the percents of change (Table 12) of the thermally aged specimens versus outdoor exposures still shows that photobleaching is a fairly rapid process. This seems to be more dramatic at the higher wavelengths (380 nm and above) where transmissions can be seen to recover by factors of three to four. This occurred during an outdoor exposure in January consisting of fairly low temperatures (50°-60° F.) and mainly overcast skies. Some photobleaching may also be observed in the specimen sealed in argon; however, the rates are about one third that of the specimen exposed to air. This might be even lower if the oxygen dissolved in the polymer during its high temperature exposure had been removed.

Chemically, atmospheric oxygen has probably reacted with the thermally formed double bonds in the EVA, broken up their conjugation, and led to saturated species. Although some chemical degradation has likely occurred, the resulting compounds are colorless, and would have no effect on module output. Fortunately, photobleaching seems to be the most efficient in the wavelength ranges of interest.

EXAMPLE 5

HALS compounds are moderately strong bases that may, under certain conditions, combine with acidic compounds to form colored species. This is suspected to be the cause of color in cases where yellow "brush marks" are seen from the application of primer. These brush marks also indicate that far too much primer is being applied. The primer is a methacrylate compound as discussed previously, and may be stabilized with very small quantities of a phenolic compound such as hydroquinone methyl ether (MEHQ), or butylated hydroxytoluene (BHT). These stabilizers may be acidic enough to couple with an HALS. Additionally, any other acidic compounds added to the EVA as stabilizers might accidentally result in a color reaction having nothing to do with polymer degradation.

This theory was tested by reacting each of five HALS stabilizers with an equivalent amount ($10^{-4}$ moles) of BHT in a toluene solution at 65° C. The results are recorded in Table 13.

TABLE 13

| COLOR REACTIONS WITH BHT & HALS COMPOUNDS[a] | | | | |
|---|---|---|---|---|
| HALS | 100 Hrs | 200 Hrs | 500 Hrs | 1000 Hrs |
| 1. Tinuvin 770 | n/c | Dark Yellow/Brown | | |
| 2. Tinuvin 123 | n/c | n/c | n/c | very slight yellow |
| 3. Tinuvin 622D | n/c | n/c | n/c | n/c |
| 4. Chimassorb 944 | n/c | n/c | slight yellow | brown |
| 5. Cyasorb UV-3346 | n/c | n/c | slight yellow | yellow |
| 6. Silane A-174[b] | n/c | n/c | n/c | slight yellow | nc/ = No color change
[a] $10^{-4}$ Moles of HALS and BHT dissolved in 30 ml toluene, held at 65° C.
[b] No additional BHT added to the silane.

No color was observed in any of the reactions until 200 hours had passed, after which the reaction containing the "TINUVIN-770" HALS turned a dark yellow/brown color. The other reactions showed only faint signs of coloration until the 500 hours had passed. At this point the formulations containing the HALS compounds sold under the trademarks "CHIMASSORB-944" and "CYASORB UV-3346" also developed noticeable yellow colors that grew stronger toward the 1,000 hour point. The "TINUVIN-123" and "TINUVIN-622LD" HALS formulations showed almost no color reaction at all. No further discoloration or changes were noticed beyond the 1,000 hour point at 65° C.

The reaction vials were placed in bright sunlight for three weeks (500 hours) to determine if the colored complexes would photo-bleach. No change in color was noted during this time and the reaction products appeared to be light stable.

"ELVAX 150" EVA is known to contain approximately 750 ppm (0.075%) of BHT, and is added intentionally by the manufacturer to prevent changes in melt viscosity during processing. This is a relatively small quantity, and is almost certainly destroyed by the peroxide during cure. It is unlikely that much of any color results from its presence.

Several important conclusions can be made from the experiments disclosed in the above Examples. Although several of the HALS compounds may be useful depending on the particular requirements, the "TINUVIN 622LD" and the "LUPERSOL HA-505" formulations were superior. These newly identified HALS compounds offer four to five times the stabilization efficiency of the "TINUVIN-770" formulations. Also, an ultraviolet stabilizer did not effect an HALS compound's ability to minimize thermal discoloration. The degree of fluorescence is also unaffected by the presence or type of HALS stabilizer present.

While this invention has been described with reference to specific embodiments, it is not necessarily limited thereto. Accordingly, the appended claims should be construed to encompass not only those forms and embodiments of the invention specifically described above, but to such other forms and embodiments as may be devised by those skilled in the art without departing from its true spirit and scope.

What is claimed:

1. A method for encapsulating a solar cell to minimize discoloration, said method comprising the steps of:
    mixing an ethylene-vinyl acetate copolymer, a curing agent, and a hindered amine light stabilizer selected from the group consisting of O,O-t-Amyl-O-(1,2,2,6,6-Pentamethyl-4-piperidinyl) monoperoxycarbonate and Poly [(4-hydroxy-2,2,6,6-tetramethyl-1-piperidine-ethanol )-co-dimethyl succinate] to form a mixture;
    applying said mixture to the solar cell; and
    curing the applied mixture to form a thermoset encapsulant for the solar cell.

2. A method in accordance with claim 1 wherein the step of mixing includes adding a primer to form the mixture.

3. A method in accordance with claim 1 wherein said curing agent is 25-Dimethyl-2,5-Di-t-Butylperoxyhexane.

4. A method in accordance with claim 1 wherein said curing agent is O,O-t-Butyl-O-(2-ethylhexyl) monoperoxycarbonate.

5. A method in accordance with claim 1 wherein said hindered amine light stabilizer is added in an amount in the range of 0.1 to 0.5 parts per hundred parts ethylene-vinyl acetate copolymer and said curing agent is added in an amount equivalent to 1.5 parts per hundred parts ethylene-vinyl acetate copolymer.

6. A method in accordance with claim 1 wherein said ethylene-vinyl acetate copolymer has a vinyl acetate content between 25% and 35%.

7. A product produced by the method of claim 1.

* * * * *